US012770842B1

(12) United States Patent
Williams et al.

(10) Patent No.: US 12,770,842 B1
(45) Date of Patent: Oct. 20, 2026

(54) DEVICE AND METHOD FOR PLASMA TREATMENT OF ELECTRONIC MATERIALS

(71) Applicant: Surfx Technologies LLC, Redondo Beach, CA (US)

(72) Inventors: Thomas Scott Williams, Los Angeles, CA (US); Robert F. Hicks, Los Angeles, CA (US)

(73) Assignee: Surfx Technologies LLC, Redondo Beach, CA (US)

( * ) Notice: Subject to any disclaimer, the term of this patent is extended or adjusted under 35 U.S.C. 154(b) by 427 days.

(21) Appl. No.: 18/105,644

(22) Filed: Feb. 3, 2023

Related U.S. Application Data

(60) Continuation-in-part of application No. 17/939,744, filed on Sep. 7, 2022, now abandoned, which is a
(Continued)

(51) Int. Cl.
*H01J 37/32* (2006.01)
*C23C 16/50* (2006.01)
(Continued)

(52) U.S. Cl.
CPC ........ *H01J 37/32825* (2013.01); *C23C 16/50* (2013.01); *H01J 37/32091* (2013.01);
(Continued)

(58) Field of Classification Search
CPC ............. H01J 37/32825; H01J 37/3244; H01J 37/32174; H01J 37/32091;
(Continued)

(56) References Cited

U.S. PATENT DOCUMENTS 3,437,864 A 4/1969 Kofoid et al.
4,088,926 A 5/1978 Fletcher et al.
(Continued)

FOREIGN PATENT DOCUMENTS

JP 2009127981 6/2009
WO WO 02/060828 8/2002

OTHER PUBLICATIONS

Inomata et al., Open air deposition of SiO2 film from a cold plasma torch of tetramethoxysilane-H2-Ar system, Appl. Phys. Lett., Jan. 3, 1994, pp. 46-47, 64(1).
(Continued)

*Primary Examiner* — Binh X Tran
*Assistant Examiner* — Christopher Remavege
(74) *Attorney, Agent, or Firm* — Canady & Lortz LLP; Bradley K. Lortz

(57) ABSTRACT

Plasma applications are disclosed that operate with argon and other molecular gases at atmospheric pressure, and at low temperatures, and with high concentrations of reactive species. The plasma apparatus and the enclosure that contains the plasma apparatus and the substrate are substantially free of particles, so that the substrate does not become contaminated with particles during processing. The plasma is developed through capacitive discharge without streamers or micro-arcs. The techniques can be employed to remove organic materials from a substrate, thereby cleaning the substrate; to activate the surfaces of materials, thereby enhancing bonding between the material and a second material; to etch thin films of materials from a substrate; and to deposit thin films and coatings onto a substrate; all of which processes are carried out without contaminating the surface of the substrate with substantial numbers of particles.

10 Claims, 13 Drawing Sheets

Related U.S. Application Data division of application No. 16/559,950, filed on Sep. 4, 2019, now abandoned, which is a continuation of application No. PCT/US2019/049556, filed on Sep. 4, 2019.

(60) Provisional application No. 62/726,905, filed on Sep. 4, 2018.

(51) Int. Cl.

| | |
|---|---|
| ***H10P 70/00*** | (2026.01) |
| ***H10P 72/00*** | (2026.01) |
| ***H10W 70/04*** | (2026.01) |

(52) U.S. Cl.

CPC .... *H01J 37/32174* (2013.01); *H01J 37/3244* (2013.01); *H10P 70/20* (2026.01); *H10P 72/0406* (2026.01); *H10P 72/0421* (2026.01); *H10W 70/042* (2026.01); *H01J 2237/3321* (2013.01); *H01J 2237/3341* (2013.01); *H01J 2237/335* (2013.01)

(58) Field of Classification Search

CPC ......... H01J 2237/3321; H01J 2237/335; H01J 2237/3341; H01L 21/67028; H01L 21/67069; H01L 21/02057; H01L 21/4828; H01L 21/02274; H01L 21/02216; H01L 21/02126; H01L 21/02046; H01L 21/02068; H01L 21/4835; C23C 16/50; C23C 16/509; H10P 70/20; H10P 72/0406; H10P 72/0421; H10W 70/042

See application file for complete search history.

(56) References Cited

U.S. PATENT DOCUMENTS

| | | | | |
|---|---|---|---|---|
| 4,434,742 | A | 3/1984 | Henaff et al. | |
| 5,147,493 | A | 9/1992 | Nishimura et al. | |
| 5,198,724 | A | 3/1993 | Koinuma et al. | |
| 5,285,046 | A | 2/1994 | Hansz | |
| 5,309,063 | A | 5/1994 | Singh | |
| 5,414,324 | A | 5/1995 | Roth et al. | |
| 5,789,867 | A | 8/1998 | Westendorp et al. | |
| 5,849,136 | A | 12/1998 | Mintz et al. | |
| 5,961,772 | A | 10/1999 | Selwyn | |
| 5,977,715 | A | 11/1999 | Li et al. | |
| 5,997,956 | A | 12/1999 | Hunt et al. | |
| 6,118,218 | A * | 9/2000 | Yializis | H01J 37/32532 219/121.36 |
| 6,204,605 | B1 | 3/2001 | Laroussi et al. | |
| 6,262,523 | B1 | 7/2001 | Selwyn et al. | |
| 6,441,553 | B1 * | 8/2002 | Yializis | H01J 37/3244 219/121.36 |
| 6,465,964 | B1 | 10/2002 | Taguchi et al. | |
| 6,659,110 | B2 | 12/2003 | Forsnel et al. | |
| 6,730,238 | B2 | 5/2004 | Li et al. | |
| 7,329,608 | B2 | 2/2008 | Babayan et al. | |
| 7,784,426 | B2 | 8/2010 | Schmitt | |
| 8,328,982 | B1 * | 12/2012 | Babayan | H05H 1/2406 156/345.43 |
| 8,632,651 | B1 | 1/2014 | Hicks et al. | |
| 9,406,485 | B1 * | 8/2016 | Cheng | H01J 37/32091 |
| 10,032,609 | B1 | 7/2018 | Cheng et al. | |
| 10,118,315 | B1 | 11/2018 | Cheng et al. | |
| 10,800,092 | B1 | 10/2020 | Cheng et al. | |
| 11,875,976 | B2 * | 1/2024 | Chambers | C23C 16/50 |
| 2001/0006093 | A1 | 7/2001 | Tabuchi et al. | |
| 2002/0008480 | A1 | 1/2002 | Yamazaki et al. | |
| 2002/0129902 | A1 | 9/2002 | Babayan et al. | |
| 2003/0113479 | A1 * | 6/2003 | Fukuda | H01J 37/32009 156/345.43 |
| 2006/0156983 | A1 * | 7/2006 | Penelon | C23C 16/402 156/345.47 |
| 2009/0200948 | A1 * | 8/2009 | Selwyn | H01J 37/32082 315/111.21 |
| 2010/0190098 | A1 | 7/2010 | Walker et al. | |
| 2010/0218896 | A1 * | 9/2010 | Ai | C23C 16/509 156/345.43 |
| 2010/0258247 | A1 * | 10/2010 | Hori | H05H 1/46 156/345.35 |
| 2010/0261302 | A1 | 10/2010 | Rana et al. | |
| 2014/0054269 | A1 | 2/2014 | Hudson et al. | |
| 2016/0008757 | A1 * | 1/2016 | Gromala | A61L 9/12 423/210 |

OTHER PUBLICATIONS

Koinuma et al., Development and application of a microbeam plasma. generator, Appl. Phys. Lett., Feb. 17, 1992, pp. 816-817, 60(7).

PCT/US2019/049556 International Search Report and Written Opinion, May 4, 2020.

Extended European Search Report Application No. 19883888.0-1211/3847301 PCT/US2019049556, Apr. 4, 2022.

* cited by examiner

Table 3. Effect of the process conditions for the atmospheric pressure, argon and oxygen plasma on the water contact angle, surface free energy and particle adders.

| Process conditions | Offset (mm) | Scan Speed (mm/s) | Process time (s) | When | Water contact angle | Surface energy (mN/m) | Particle counts | Particle add |
|---|---|---|---|---|---|---|---|---|
| Control, no treatment | - | - | - | Before | 40 | 63 | 28 | - |
| 100 mm beam, 500 W, Ar + 0.5% $O_2$ | 2 | 25 | 20 | Before | 4 | 77 | 10 | 19 |
| | | | | After | | | 29 | |
| 100 mm beam, 500 W, Ar + 0.5% $O_2$ | 6 | 25 | 20 | Before | 4 | 77 | 20 | 30 |
| | | | | After | | | 50 | |
| 100 mm beam, 500 W, Ar + 0.5% $O_2$ | 2 | 50 | 10 | Before | 3 | 77 | 20 | 1 |
| | | | | After | | | 21 | |
| 100 mm beam, 500 W, Ar + 0.5% $O_2$ | 6 | 50 | 10 | Before | 4 | 77 | 19 | 6 |
| | | | | After | | | 24 | |
| 100 mm beam, 500 W, Ar + 0.5% $O_2$ | 2 | 100 | 5 | Before | 3 | 77 | 10 | 5 |
| | | | | After | | | 15 | |
| 100 mm beam, 500 W, Ar + 0.5% $O_2$ | 6 | 100 | 5 | Before | 5 | 77 | 15 | 0 |
| | | | | After | | | 15 | |
| 100 mm beam, 500 W, Ar + 0.5% $O_2$ | 2 | 150 | 3.3 | Before | 3 | 77 | 10 | 7 |
| | | | | After | | | 17 | |
| 100 mm beam, 300 W, Ar + 0.25% $O_2$ | 2 | 50 | 10 | Before | 4 | 77 | 20 | 2 |
| | | | | After | | | 22 | |
| 100 mm beam, 300 W, Ar + 0.25% $O_2$ | 6 | 50 | 10 | Before | 7 | 76 | 24 | 3 |
| | | | | After | | | 27 | |
| 100 mm beam, 300 W, Ar + 0.25% $O_2$ | 2 | 100 | 5 | Before | 4 | 77 | 34 | 1 |
| | | | | After | | | 35 | |
| 100 mm beam, 300 W, Ar + 0.25% $O_2$ | 2 | 150 | 3.3 | Before | 8 | 76 | 17 | 10 |
| | | | | After | | | 27 | |

FIG. 12

Table 4. Effect of the process conditions for the atmospheric pressure, argon and hydrogen plasma on the water contact angle, surface free energy and particle adders.

| Process conditions | Offset (mm) | Scan speed (mm/s) | Process time (s) | When | Water contact angle | Surface energy (mN/m) | Particle counts | Particle add |
|---|---|---|---|---|---|---|---|---|
| Control, no treatment | | - | | Before | 48 | 57 | 28 | |
| Scan while purging, no plasma | 2 | 25 | 20 | After | - | - | 29 | 1 |
| 100 mm beam, 500 W, Ar + 1.0% $H_2$ | 2 | 25 | 20 | Before | 2 | 77 | 24 | 16 |
| | | | | After | | | 40 | |
| 100 mm beam, 500 W, Ar + 1.0% $H_2$ | 2 | 25 | 20 | Before | 2 | 77 | 63 | 7 |
| | | | | After | | | 70 | |
| 100 mm beam, 500 W, Ar + 1.0% $H_2$ | 6 | 25 | 20 | Before | 17 | 75 | 25 | 3 |
| | | | | After | | | 28 | |
| 100 mm beam, 500 W, Ar + 1.0% $H_2$ | 2 | 50 | 10 | Before | 2 | 77 | 38 | 3 |
| | | | | After | | | 41 | |
| 100 mm beam, 500 W, Ar + 1.0% $H_2$ | 2 | 100 | 5 | Before | 3 | 77 | 41 | 10 |
| | | | | After | | | 51 | |
| 100 mm beam, 300 W, Ar + 1.0% $H_2$ | 2 | 25 | 20 | Before | 2 | 78 | 25 | -6 |
| | | | | After | | | 19 | |
| 100 mm beam, 300 W, Ar + 1.0% $H_2$ | 2 | 25 | 20 | Before | 2 | 78 | 13 | 4 |
| | | | | After | | | 17 | |

FIG. 13

DEVICE AND METHOD FOR PLASMA TREATMENT OF ELECTRONIC MATERIALS

CROSS-REFERENCE TO RELATED APPLICATIONS

This continuation-in-part application claims the benefit under 35 U.S.C. § 119 of the following co-pending and commonly assigned U.S. utility patent application:

U.S. patent application Ser. No. 17/939,744, filed Sep. 7, 2022, by Williams et al., which application is a Divisional of U.S. patent application Ser. No. 16/559,950, filed Sep. 4, 2019, by Williams et al., entitled "DEVICE AND METHOD FOR PLASMA TREATMENT OF ELECTRONIC MATERIALS,", which application both claims the benefit of U.S. Provisional Patent Application No. 62/726,905, filed Sep. 4, 2018, and entitled "DEVICE AND METHOD FOR PLASMA TREATMENT OF ELECTRONIC MATERIALS," by Williams et al. and also is a Continuation of PCT/US19/49556, filed Sep. 4, 2019, which applications are all incorporated by reference herein.

BACKGROUND OF THE INVENTION

1. Field of the Invention

The invention is related to a plasma apparatus and methods of using the plasma apparatus for cleaning, surface activation, etching and deposition on electronic materials without substantial addition of particles to the substrate.

2. Description of Related Art

Ionized gas plasmas have found wide application in materials processing. Plasmas that are used in materials processing are generally weakly ionized, meaning that a small fraction of the molecules in the gas are charged. In addition to the ions, these plasmas contain reactive species that can clean, activate, etch and deposit thin films onto surfaces. The temperature in these weakly ionized gases is usually below 250° C., so that most thermally sensitive substrates are not damaged. The physics and chemistry of weakly ionized plasmas are described in several textbooks. See for example, Lieberman and Lichtenberg, "Principles of Plasma Discharges and Materials Processing," (John Wiley & Sons, Inc., New York, 1994), and Raizer, Y. P., "Gas Discharge Physics", (Springer-Verlag, Berlin (1991).

According to the literature, weakly ionized plasmas are generated in vacuum at pressures between 0.001 and 1.0 Torr (see Lieberman and Lichtenberg (1994)). Electrical power is applied across two electrodes to break the gas down and ionize it. The electricity may be provided as a direct current (DC), alternating current (AC), radio frequency (RF), or microwave (MW) source. The electrode may be constructed to provide either capacitive or inductive coupling to strike and maintain the plasma. In the former case, two conducting electrodes are placed inside the vacuum chamber filled with a small amount of gas. One of the electrodes is powered, or biased, by the RF generator, while the other one is grounded. In the latter case, the RF power is supplied through an antenna that is wrapped in a coil around the insulating walls of the chamber. The oscillating electric field from the coil penetrates into the gas inducing ionization.

Electronic materials, including silicon, gallium arsenide, silicon carbide, sapphire and glass wafers, are inserted into the vacuum chamber and processed by striking the plasma and running it for a period of time to modify the surface of the wafer. Standard semiconductor wafer sizes are 100, 150, 200 and 300 mm in diameter. The vacuum chamber is designed specifically to fit one of the wafer sizes. One way to clean the silicon surface is to feed oxygen and argon to the chamber. Energetic free electrons in the plasma convert a portion of the oxygen molecules to O atoms and other reactive species that attack the organic contaminants on the substrate surface and convert them into gaseous carbon dioxide. In addition, the surface may be physically sputtered of contaminants by bombardment of the substrate with positively charge argon ions ($Ar^4$). Following oxygen plasma treatment for several minutes in the vacuum chamber, the silicon wafer surface is clean and activated for other semiconductor processing steps, including, but not limited to, wafer bonding.

Another way to clean the surface of an electronic material is to insert the substrate into the vacuum chamber and to strike the plasma with a feed gas containing a mixture of hydrogen and argon. In this case, the energetic free electrons will produce H atoms and Art ions that will strike the surface of the substrate and remove metal oxide contaminates, including, but not limited to, copper oxide, silver oxide, tin oxide, or indium oxide. To prevent a safety hazard by introducing hydrogen into a chamber, the feed gas to the plasma must contain less than 4.0% $H_2$ in argon. At the operating pressure of the vacuum chamber, 0.05 to 0.50 Torr, the resulting concentration of hydrogen is only 2 to 20 milliTorr. The rate of hydrogen atom etching of the metal oxide will be extremely low, so that most of the oxide contaminant is removed by sputtering.

Semiconductor substrates are etched in vacuum plasmas by generating reactive species in the gas that convert elements on the substrate surface into stable gas molecules. The stable gas molecules are then pumped out of the chamber. For example, silicon is removed from Si wafers by the following reaction: $Si_{(s)}+4F_{(g)}=SiF_{4(g)}$, where the subscripts s and g refer to solid and gas, respectively, Fluorine atoms are generated in the plasma by the electron impact dissociation of carbon tetrafluoride ($CF_4$) into carbon and fluorine atoms. If a polymer mask is deposited on the surface that prevents etching of the underlying silicon substrate in selected areas, then a pattern of silicon transistors can be etched into the Si wafer (see Lieberman and Lichtenberg (1994)). Ion bombardment of the wafer surface adds vertical directionality to the silicon etching process. The etching of other materials, including certain metals, can be accomplished with chlorine plasmas, and are obvious to those skilled in the art of plasma processing.

Etching copper oxide films off of copper substrates is an important process in semiconductor manufacturing. The dies containing the integrated circuits are attached to copper lead frame strips, where wires are attached from output pads on the dies to the leads, and then the entire package is encapsulated in a mold compound. It has been found that if copper oxide films are present on the lead frame strips delamination will occur at the die pad-mold interface (see for example, L. C. Yung, L. C. Ying, C. C. Fei, A. T. Ann and S. Norbert, "Oxidation on copper lead frame surface which leads to package delamination," IEEE Proceedings of the International Conference on Software Engineering, 2010, Kuala Lumpur, Malaysia, p. 654; and C. T. Chong, A. Leslie, L. T. Beng, and C. Lee, "Investigation on the effect of copper leadframe oxidation on package delamination," IEEE Proceedings of the 45th Electronic Components and Technology Conference, Las Vegas, NV, USA, p. 463) Failure occurs between the copper oxide and copper metal base rather than between the mold compound and copper oxide surface. As the oxide layer grows on the base metal, voids develop in the interface, weakening the bond between the layers. Therefore, removing the oxide layer and eliminating the interfacial voids is necessary to prevent delamination of the protective mold. Vacuum plasmas are poorly suited to this application due to the very low concentration of hydrogen that may be fed into the chamber.

The plasma-enhanced chemical vapor deposition of thin films (PECVD) is carried out in vacuum plasma chambers as well. Here, a volatile precursor molecule is introduced into the chamber that contains the elements in the desired film. Reactive species produced in the plasma breakdown the precursor molecules, liberating the elements that are subsequently incorporated into the growing film on the wafer surface. For example, silicon dioxide ($SiO_2$) can be deposited in trenches etched onto silicon wafers by the decomposition of tetraethoxysilane ($Si(OC_2H_4)_4$) in an oxygen plasma. The overall reaction may be represented as follows: $Si(OC_2H_4)_{4(g)}+22O_{(g)}=SiO_{2(s)}+8CO_{2(g)}+8H_2O_{(g)}$. The plasma process conditions are selected to achieve the desired film properties. For example, if a stable insulator with high dielectric strength is desired to isolate adjacent semiconductor transistors, then a pure glass film is deposited in trenches on the Si wafer by heating the substrate to a high temperature, for example, 500° C., and limiting the amount of precursor in the vacuum chamber to slow down the deposition rate and to achieve a large excess of oxygen to convert all the carbon and hydrogen from the precursor into carbon dioxide and water. Many other thin films on electronic materials are produced by plasma-enhanced chemical vapor deposition, and are obvious to those skilled in the art of PECVD.

One of the drawbacks of vacuum plasma processing of electronic materials is that the chambers become dirty upon repeated processing of semiconductor wafers. The chambers slowly fill up with particles (i.e., contamination) ranging in size from 0.01 to 10.0 microns in diameter. This problem has been documented in many publications (see for example, G. S. Selwyn, et al., J. Vac. Sci. Technol. A 7, 2758 (1989); ibid., 8, 1726 (1990); M. J. McCaughey and M. J. Kushner, Appl. Phys. Lett. 55, 951 (1989); R. N. Nowlin and R. N Carlile, J. Vac. Sci. Technol. A 9, 2824 (1990); G. S. Selwyn, Jpn. J. Appl. Phys. 32, 3068 (1993); and S. J. Choi, et al., Plasma Sources Sci. Technol. 4, 418 (1994); and R. L. Merlino and J. A. Goree, Physics Today 1 (July 2004)). When the plasma is turned on, the particles become negatively charged and as a result of the electric field in the chamber, float over the wafer surface. When the plasma is turned off, the particles drop down on the wafer, forming a thin layer of contamination. It is well known to those skilled in the art that particles present during wafer processing can kill solid-state devices. The semiconductor industry is obsessed with eliminating them, and spends billions of dollars constructing cleanrooms that are free of particles above 0.01 microns in diameter. Dirty plasma chambers must be routinely cleaned to reduce particle contamination. In addition, wafers have to be wet cleaned after plasma immersion to eliminate any particles that may have stuck to them. All this drives up the cost of manufacturing electronic devices. In conclusion, there is a need for improved plasma processing devices and methods that do not generate particles.

Atmospheric pressure plasmas have been developed as an alternative to vacuum plasmas. The different types of atmospheric pressure plasma devices have been described in multiple publications (Schutze, et. al., IEEE Trans. Plasma Sci. 26, 1685 (1998); Goldman and Sigmond, IEEE Trans. Electrical Insulation EI-17, no. 2, 90 (1982); Eliasson and Kogelschatz, IEEE Trans. Plasma Sci. 19, 1063 (1991); Fauchais and Vardelle, IEEE Trans. Plasma Sci. 25, 1258 (1997); Moravej, et al., J. Appl. Phys. 96, 7011 (2004); and Babayan and Hicks, U.S. Pat. No. 7,329,608 (Feb. 12, 2008) and U.S. Pat. No. 8,328,982 (Dec. 11, 2012)). These plasmas have not been adopted for semiconductor manufacturing for a number of reasons. They generate non-uniform beams of reactive gas containing sparks or streamers that can damage the solid-state devices on the semiconductor wafer. They can generate too much UV light, or cause electrostatic discharge onto the substrate. In many cases, atmospheric pressure plasmas do not have a protective sheath at the electrode surfaces, so that energetie ions collide with said surfaces and etch off particulate matter. It is known to those skilled in the art that these plasmas are dirtier than the vacuum plasmas used in semiconductor processing.

In view of the foregoing, there is a need for a plasma device and method that is suitable for electronic materials processing, and that does not generate particles which can be harmful to manufacturing operations. These and other needs are met by embodiments of the present invention as described hereafter.

SUMMARY OF THE INVENTION

Plasma applications are disclosed that operate with argon and other molecular gases at atmospheric pressure, and at low temperatures, and with high concentrations of reactive species. The plasma apparatus and the enclosure that contains the plasma apparatus and the substrate are substantially free of particles, so that the substrate does not become contaminated with particles during processing. The plasma is developed through capacitive discharge without streamers or micro-arcs. The techniques can be employed to remove organic materials from a substrate, thereby cleaning the substrate; to activate the surfaces of materials, thereby enhancing bonding between the material and a second material; to etch thin films of materials from a substrate; and to deposit thin films and coatings onto a substrate; all of which processes are carried out without contaminating the surface of the substrate with substantial numbers of particles. Some notable embodiments of the invention are described hereafter.

A typical apparatus embodiment for producing an ionized gas plasma includes a housing having an inlet for gas flow comprising argon and one or more molecular gases, a flow path within the housing for directing the gas flow, and an outlet for argon plasma comprising reactive neutral species, a powered electrode disposed within the housing having a powered electrode surface exposed to the gas flow in the flow path, a grounded electrode disposed adjacent to the powered electrode such that a grounded electrode surface is spaced to 3 mm or less from the powered electrode surface and the gas flow is directed therebetween in the flow path, and a power supply for delivering radio frequency power coupled to the powered electrode and the grounded electrode to cause the gas to become weakly ionized at a forward power between 100 and 600 W per 100 mm length of the electrodes, and to produce the reactive neutral species in the gas flow in the flow path, wherein a material substrate is disposed beneath the outlet of the housing to receive the reactive neutral species in the gas flow, thereby treating said material substrate with minimal particles deposited. The molecular gases can be selected from a molecular gas group consisting of oxygen, nitrogen and hydrogen. Furthermore, a distance between the outlet of the housing and the material substrate can be maintained to be less than 10 mm. In some embodiments, the outlet can be scanned over the material substrate at a speed between 1 and 300 mm/s. Furthermore, the forward power from the radio frequency power supply can be maintained between 300 and 550 W per 100 mm length of the electrode. The power supply can operate at a radio frequency of 13.56 or 27.12 MHz and include a tuning network that impedance matches the radio frequency power supply to the argon plasma to minimize reflected power. The one or more molecular gases can be added to the argon gas flow at a concentration between 0.1 to 2.0 volume %, and a fraction of the one or more molecular gases dissociates into atoms within the argon plasma, and then flows out of the outlet, wherein the atoms are selected from an atom group comprising O, H, N, F, C and S atoms. In some embodiments, the reactive neutral species from the ionized gas plasma can be used for cleaning organic contamination from the material substrate, removing oxide layers from metal structures on the material substrate, activating the material substrate surface for adhesion, etching a thin film off of the material substrate, or depositing a thin film onto the material substrate, all with minimal particles deposited. In further embodiments, the housing can be disposed within an enclosure at atmospheric pressure. The enclosure can have laminar gas flow that is introduced through a high-efficiency particle filter to exclude excess particles. Typically, the gas flow through the housing can be laminar. In some embodiments, the gas flow from the outlet of the housing for the argon plasma can be between 25 and 300° C. Further, the outlet of the housing for argon plasma can comprise a linear opening. This apparatus embodiment of the invention can be further modified consistent with any of the apparatus or method embodiments further described herein as will be understood by those skilled in the art.

Similarly, a typical method embodiment for producing an ionized gas plasma includes flowing a gas flow through an inlet into a housing, the gas flow comprising argon and one or more molecular gases, flowing the gas flow within the housing through a flow path for directing the gas flow, disposing a powered electrode within the housing having a powered electrode surface exposed to the gas flow in the flow path, disposing a grounded electrode adjacent to the powered electrode such that a grounded electrode surface is spaced to 3 mm or less from the powered electrode surface and the gas flow is directed therebetween in the flow path, delivering radio frequency power with a power supply coupled to the powered electrode and the grounded electrode to cause the gas to become weakly ionized at a forward power between 100 and 600 W per 100 mm length of the electrodes, and to produce reactive neutral species in the gas flow in the flow path, flowing the gas flow comprising the reactive neutral species from an outlet of the housing for argon plasma, and disposing a material substrate beneath the outlet of the housing to receive the reactive neutral species in the gas flow, thereby treating said material substrate with minimal particles deposited. This method embodiment of the invention can be further modified consistent with any of the apparatus or method embodiments further described herein as will be understood by those skilled in the art.

Further embodiments of the invention comprise a plasma apparatus and method that utilizes argon and other molecular gases to clean, activate, etch and deposit thin films onto electronic materials, including semiconductor wafers. The plasma apparatus and substrate is placed inside an enclosure that contains a means of removing the particles from the air so that no particles come in contact with the substrate during plasma processing. The enclosure may be a cabinet with a filter fan unit (FFU), or it may be a class 100 or higher cleanroom. The plasma is generated in a self-contained housing that contains two electrodes connected to radio frequency (RF) power. A high density of reactive species is generated within the device by collisions between molecules and the energetic free electrons in the discharge. The reactive species flow out of the housing and onto the substrate that is placed a short distance downstream. The housing is supplied with RF power and with a controlled flow of argon and other molecular gases in a proportion of about 99% argon and 1% molecular gas to generate a stable plasma that cleans, activates, etches, or deposits the thin film onto the substrate. The gas flow supplied to the system is passed through filters to remove any particles introduced from the gas storage tanks. The plasma apparatus and method further contain a means of uniformly contacting the substrate by scanning the self-contained housing over said substrate, or by spinning the substrate underneath the housing.

In one embodiment of the invention, contaminated surfaces are cleaned through exposure to the reactive gas species generated by the plasma. To remove organic contamination, oxygen or hydrogen molecules are added to the argon gas entering the housing. The concentration of oxygen or hydrogen fed to the plasma is in the range from 0.1% to 5.0%, preferably from 0.25% to 1.0%. The plasma then converts the oxygen molecules into O atoms and other reactive species, or the hydrogen molecules into H atoms. This gas flow is directed onto the substrate surface to be cleaned. An example of this process is the cleaning and activation of silicon wafers. The native oxide layer on the silicon is initially contaminated with a layer of adsorbed organic compounds. The reactive oxygen or hydrogen species generated in the argon/oxygen or argon/hydrogen plasma react with the organic compounds, converting them into water vapor, carbon dioxide and possibly other volatile species, leaving behind a silicon dioxide surface free of contamination. The plasma apparatus in this embodiment of the invention is in an enclosure which is free of particles so there is no deposition of particles onto the silicon wafer surface either from the gas flow emanating from the plasma, or the filtered air inside the enclosure. In one embodiment, the enclosure is a cleanroom, in another embodiment the enclosure is a hood with a filter fan unit.

In another embodiment of the invention, silicon dies are cleaned of organic contamination with the plasma apparatus and method immediately prior to attaching the dies to the lead frame strip. Die attach is the first step in the semiconductor packaging operation. Organic contamination on the dies can prevent adhesion of the die to the lead frame strip, and result in a defective package. This embodiment of the invention ensures that strong adhesion of the die to the lead frame is achieved.

In another embodiment of the invention, the plasma gas is used to etch layers of material, including metals, metal oxides, polymers, or semiconductors, from a substrate surface. In the case of etching metals, metal oxides, semiconductors or ceramics, gas molecules containing hydrogen, fluorine, or chlorine are added to the argon flow into the self-contained housing. When RF power is applied to the electrodes inside the housing, the gas flow becomes ionized, and the energetic free electrons produced therefrom collide with the gas molecules, causing them to dissociate into fragments and liberate hydrogen, fluorine or chlorine atoms. These atoms flow out of the housing and impinge on the substrate placed a short distance downstream. Etching occurs by the reaction of the H, F or Cl atoms with the metals, metal oxides, semiconductors, or ceramics exposed on the wafer surface.

In one embodiment, copper oxide is etched with hydrogen atoms by the following reaction: $CuO_{(s)}+2H_{(g)}=Cu_{(s)}+H_2O_{(g)}$. In this case, hydrogen molecules are added to the argon gas entering the housing and dissociated into H atoms by the plasma. The H atoms flow out of the housing and impinge on a substrate comprising copper and other materials, and remove the copper oxide layer. The concentration of hydrogen fed to the plasma is in the range from 0.1% to 5.0%, preferably from 0.25% to 1.0%. One example of a substrate is copper lead frame strips. Copper oxide can form on the surface of copper lead frame strips preventing strong adhesion of wires to the copper bond pads, and of the mold compound to the copper leads. Removing the copper oxide from the copper lead frame surface ensures that strong adhesion is obtained with the wire bonds and the mold compound to the lead frame. Additionally, no particles are deposited onto the lead frame strips by this process that could prevent adhesion between the mold compound and the copper surface.

In another embodiment, silicon dioxide is etched with fluorine atoms by the following reaction: $SiO_{2(s)}+4F_{(g)}=SiF_{4(g)}+O_{2(g)}$. An example of this process is the etching of thin glass films on the surface of silicon wafers. Many other etching reactions are possible and would be obvious to those skilled in the art. In this embodiment of the invention, the reactive gas flow emanating from the plasma inside the housing does not contain any particles and the apparatus is contained within an enclosure free of particles, so that there is no deposition of particles onto the substrate during the etching reaction.

Another embodiment of the invention comprises an apparatus and method for depositing thin films onto a substrate without the co-deposition of particles. A suitable precursor molecule is selected so that its reaction products will generate the desired coating. In this case, oxygen, nitrogen, hydrogen or another gas can be mixed with the argon gas fed into the plasma source. These molecules get dissociated inside the plasma and produce a reactive gas stream that includes for example, O, N, or H atoms. Precursor molecules are mixed with the reactive gas stream at the exit of the plasma source. The resulting mixture then impinges on a substrate where deposition of the thin film occurs. In one embodiment of the invention, $O_2$ and argon are fed to the plasma, generating a flow of reactive species at the exit of the plasma source that contains O atoms. Then a volatile organosilane precursor, including tetraethoxysilane, or tetramethyl-cyclotetrasiloxane, is mixed with the reactive gas flow. This reactive mixture impinges onto a substrate, including a silicon, gallium arsenide, silicon carbide, sapphire, or glass wafer or sheet, placed in the flow path, resulting in the deposition of a silicon dioxide film without co-deposition of a substantial number of particles.

In one notable example embodiment, an apparatus for producing a low-temperature, atmospheric pressure plasma, comprises a housing having an inlet for gas flow comprising argon and one or more molecular gases, an outlet for plasma comprising reactive neutral species, and a flow path within the housing for directing the gas flow to become laminar, a power electrode disposed within the housing having a powered electrode surface exposed to the laminar gas flow, a grounded electrode disposed adjacent to the powered electrode such that the grounded electrode surface is closely spaced from the powered electrode surface and the laminar gas flow is directed there between, a power supply for delivering radio frequency power coupled to the powered electrode and the grounded electrode to ionize the laminar gas flow and produce the plasma comprising the reactive neutral species. Typically, the housing can comprise the grounded electrode, and/or the outlet can comprise a linear opening. In this embodiment, the housing is placed inside an enclosure with flowing gas, wherein said gas has been filtered to prevent the introduction of particles into the space containing the housing. In addition, a substrate, including a silicon, gallium arsenide, silicon carbide, sapphire, or glass wafer or sheet, is placed a short distance downstream of the outlet of the housing so that the substrate is exposed to the reactive gas emanating therefrom.

In further embodiments, the molecular gas can be added to the argon gas flow at a concentration between 0.1 to 5.0 volume % and the molecular gas dissociates into atoms inside the plasma, and then flows out of the outlet, wherein the atoms are selected from the group consisting of O, N, H, F, Cl, C and S atoms.

In a similar manner, a method embodiment of the invention comprises the steps of directing gas flow comprising argon and one or more molecular gases from an inlet through a laminar flow path within a housing to an outlet for plasma comprising reactive neutral species, directing the laminar gas flow within the housing between the surface of a powered electrode and the surface of a grounded electrode, the grounded electrode surface closely spaced from the powered electrode surface, delivering radio frequency power coupled to the powered electrode and the grounded electrode from a power supply to ionize species in the laminar gas flow, and directing the reactive neutral species generated by the plasma from a head onto a substrate surface, wherein the housing and the substrate are contained inside an enclosure that has a particle-free gas flow. In one embodiment, the gas flow in the enclosure is laminar.

The material surface can be cleaned or etched by the reactive neutral species directed from the head. Alternately (or in addition), the material surface can obtain increased surface energy by the reactive neutral species directed from the head. This can improve adhesion properties of the material surface. The material surface can also have a thin film deposited thereon by the reactive neutral species directed from the head. A chemical precursor can be mixed with the reactive species directed from the head causing at least one element from the chemical precursor to be incorporated into the thin film deposited on the material surface. In each of these processes, the plasma gas flow is substantially free of particles and the enclosure containing the plasma source and the substrate is substantially free of particles so that few if any particles are deposited onto the substrate. This method embodiment of the invention can be further modified consistent with any of the apparatus or method embodiments described herein.

Another embodiment of the invention can also comprise an apparatus for producing an ionized gas plasma, including a housing having an inlet for gas flow comprising argon and one or more molecular gases, an outlet for argon plasma comprising reactive neutral species, and a flow path within the housing for directing the gas flow, a power electrode disposed within the housing having a powered electrode surface exposed to the gas flow, a ground electrode disposed adjacent to the power electrode such that a grounded electrode surface is closely spaced from the power electrode surface and the gas flow is directed therebetween, a power supply for delivering radio frequency power coupled to the power electrode and the ground electrode to ionize the gas flow and produce the argon plasma comprising the reactive neutral species, an enclosure having the housing contained within and including an enclosure gas flow wherein the enclosure gas flow has been filtered to remove particles from the flow, and a material substrate disposed within the enclosure near the outlet of the housing to receive the reactive neutral species in the gas flow from the ionized gas plasma. In this embodiment as well, the apparatus can be placed inside an enclosure, including a cabinet or a cleanroom, which is free of substantial numbers of particles. This apparatus embodiment of the invention can be further modified consistent with any of the apparatus or method embodiments described herein.

Typically, the argon plasma is produced by a capacitive discharge without substantially any streamers or micro-arcs and the gas inside the enclosure is at atmospheric pressure. The gas flow through the housing can be laminar, the enclosure gas flow can be laminar, and the gas flow from the outlet of the housing for the argon plasma can be between 25 and 200° C. In addition, the reactive neutral species from the ionized gas plasma can be used for cleaning organic contamination from the material substrate, activating the material substrate surface for adhesion, etching a thin film off of the material substrate, or depositing a thin film onto the material substrate, all substantially without the deposition of particles. The power supply can operate at a radio frequency of 13.56 or 27.12 MHz and includes an auto-tuning network that impedance matches the radio frequency power supply to the argon plasma to minimize reflected power. The one or more molecular gases can be added to the argon gas flow at a concentration between 0.1 to 5.0 volume % and a fraction of the one or more molecular gases dissociates into atoms inside the argon plasma, and then flows out of the outlet, wherein the atoms are selected from the group consisting of O, N, H, F, C and S atoms. The enclosure can include no more than 100,000 particles larger than 0.1 micron per cubic meter of air and the enclosure can comprise a cleanroom. Cleanrooms which produce many few particles than this are well known to those skilled in the art.

In some embodiments, the outlet of the housing for argon plasma comprises a linear opening. The linear opening can be at least as wide as the material substrate and the material substrate is passed at a constant speed relative to and contacting the reactive gas beam.

In further embodiments, the apparatus can include a means of translating the housing with the outlet for the ionized gas plasma relative to the surface of the material substrate such that the entire surface of the material substrate is uniformly treated with the reactive species from the ionized gas plasma.

An exemplary method embodiment of the invention comprises directing gas flow comprising argon and one or more molecular gases from an inlet through a flow path within a housing to an outlet for argon plasma comprising reactive neutral species, directing the gas flow within the housing between a powered electrode surface of a power electrode and a grounded electrode surface of a ground electrode, the grounded electrode surface closely spaced from the powered electrode surface, delivering radio frequency power coupled to the power electrode and the ground electrode from a power supply to ionize the gas flow and produce the argon plasma comprising the reactive neutral species, disposing the housing with the argon plasma within an enclosure including an enclosure gas flow wherein the enclosure gas flow has been filtered to remove particles from the flow, and disposing a material substrate within the enclosure near the outlet of the housing to receive the reactive neutral species. The method embodiment of the invention can be modified consistent with any apparatus embodiment described herein.

In further embodiments, the molecular gas can be selected from the group comprising oxygen and nitrogen and the material substrate is a semiconductor wafer and the surface of the semiconductor wafer is cleaned of organic contamination with the plasma. The molecular gas can be hydrogen and the material substrate can be a copper substrate and copper oxide on the copper substrate is etched away with the plasma. The copper substrate can be a lead frame strip.

These and other embodiments of the invention will become apparent to those skilled in the art from the following description including the preferred embodiments. Embodiments of the invention includes methods to clean surfaces, methods to increase surface energy and improve adhesion, methods for etching materials, and methods for depositing thin films, wherein each of these processes are carried out in such a way as to prevent the accumulation of particles on the substrate surface.

BRIEF DESCRIPTION OF THE DRAWINGS

Referring now to the drawings in which like reference numbers represent corresponding parts throughout:

FIG. 12 shows Table 3 which is a summary of the results obtained for processing 200 mm silicon wafers with the atmospheric pressure, argon and oxygen plasma; and FIG. 13 shows Table 4 which presents the results for treating the 200 mm silicon wafers with the atmospheric pressure, argon and hydrogen plasma.

DETAILED DESCRIPTION INCLUDING THE PREFERRED EMBODIMENTS

Overview

As described above, plasma applications are disclosed that process electronic materials without significant contamination of the substrate surface with particles. The plasma apparatus and the electronic material substrate are placed inside an enclosure, including a cabinet or a clean-room, with gas flow that is free of substantial numbers of particles. The plasma apparatus consists of a self-contained housing, which is supplied with radio frequency power and a flow of gas comprising argon and a molecular gas in the range of 0.1 to 5.0 volume %. Application of RF power to the electrodes inside the housing causes the gas to be ionized at atmospheric pressure and at low temperature. A high concentration of reactive species, including for example O, N, H, F, Cl, C and S atoms, is generated by free electron collisions with the gas molecules inside the plasma. Laminar flow is maintained as the gas flows into the housing, through the plasma, and out of the housing. One of the electrodes may be heated which can help to stabilize the plasma. The gas containing the reactive species is directed onto a substrate placed a short distance downstream, wherein said substrate is cleaned, activated, etched or coated with a thin film. Throughout processing the substrate in the enclosure with the plasma apparatus, few if any particles are deposited onto the substrate.

The example apparatus and method produces a low-temperature, atmospheric pressure argon plasma by flowing a mixture of argon and molecular gases through a housing containing two closely spaced electrodes, applying radio frequency power to one of the electrodes (grounding the other) sufficient to strike and maintain the ionized gas plasma, and flowing reactive neutral species out of the housing, while keeping the free electrons and ions inside the housing between the electrodes. Further details for operating a suitable plasma delivery device for implementing an embodiment of the invention can be found in U.S. Pat. Nos. 9,406,485 and 10,032,609, which are both incorporated by reference herein.

Figure 1:
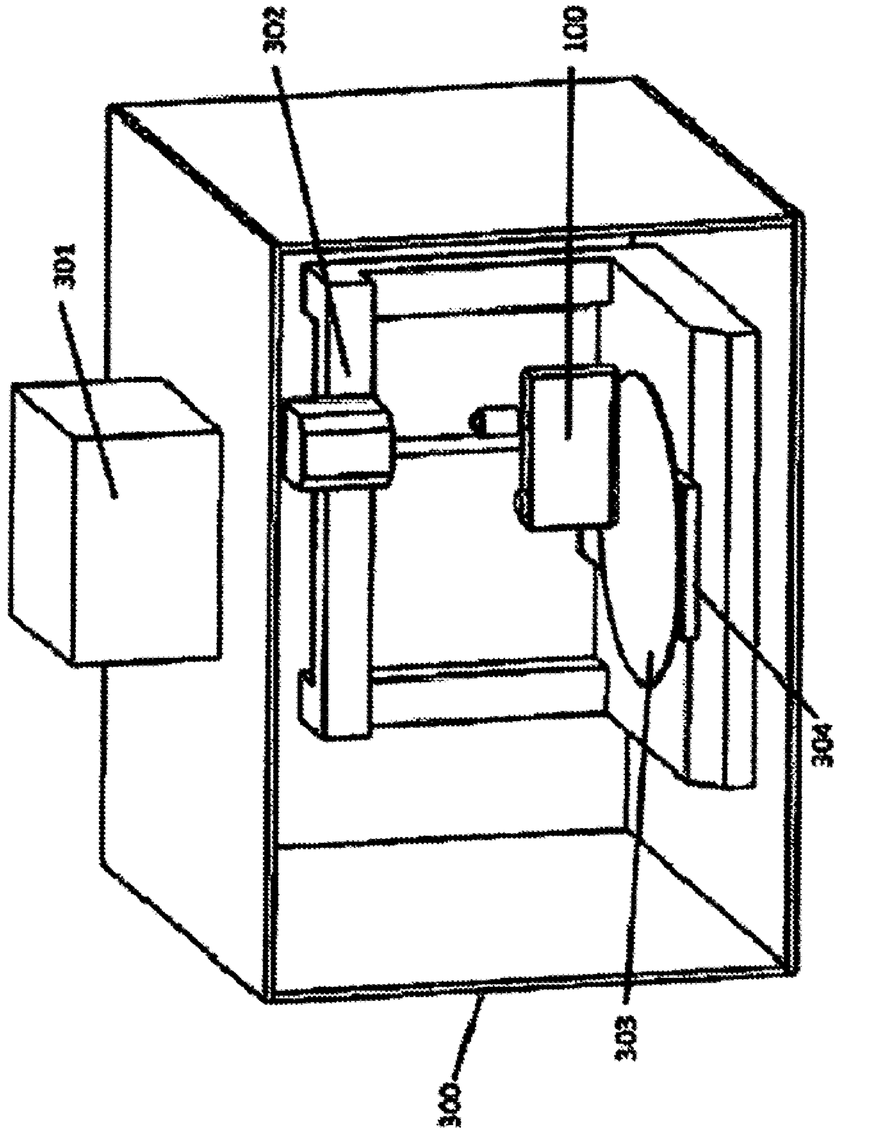
FIG. 1 is a schematic diagram of an exemplary apparatus embodiment of the invention, in which the plasma device is scanned over the substrate wafer using a robot.

FIG. 1 shows a schematic of an exemplary apparatus for plasma processing of electronic materials, in a way that is free of the deposition of substantial numbers of particles on the substrate. The apparatus includes an enclosure 300 that is equipped with a filtration system 301 that introduces a flow of gas, including, but not limited to, air, that is substantially free of entrained particles. In one embodiment, the flow of gas inside the enclosure is laminar. An argon plasma device 100 is mounted inside the enclosure on a robot 302 with the ability to scan the plasma device 100 in the x and y directions at a distance z over a substrate 303. The substrate 303 is secured onto the robotic stage 304. The enclosure 300 may be a cabinet with a filter fan unit, a cleanroom, or another suitable three-dimensional space for mounting the robot and plasma device inside. The substrate 303 may be any material, including, but not limited to, a silicon wafer, a compound semiconductor wafer, a silicon carbide wafer, a sapphire wafer, a glass sheet, a plastic sheet, a molded plastic part, a metal lead frame strip, a printed circuit board, a display, or a flexible circuit.

Figure 2:
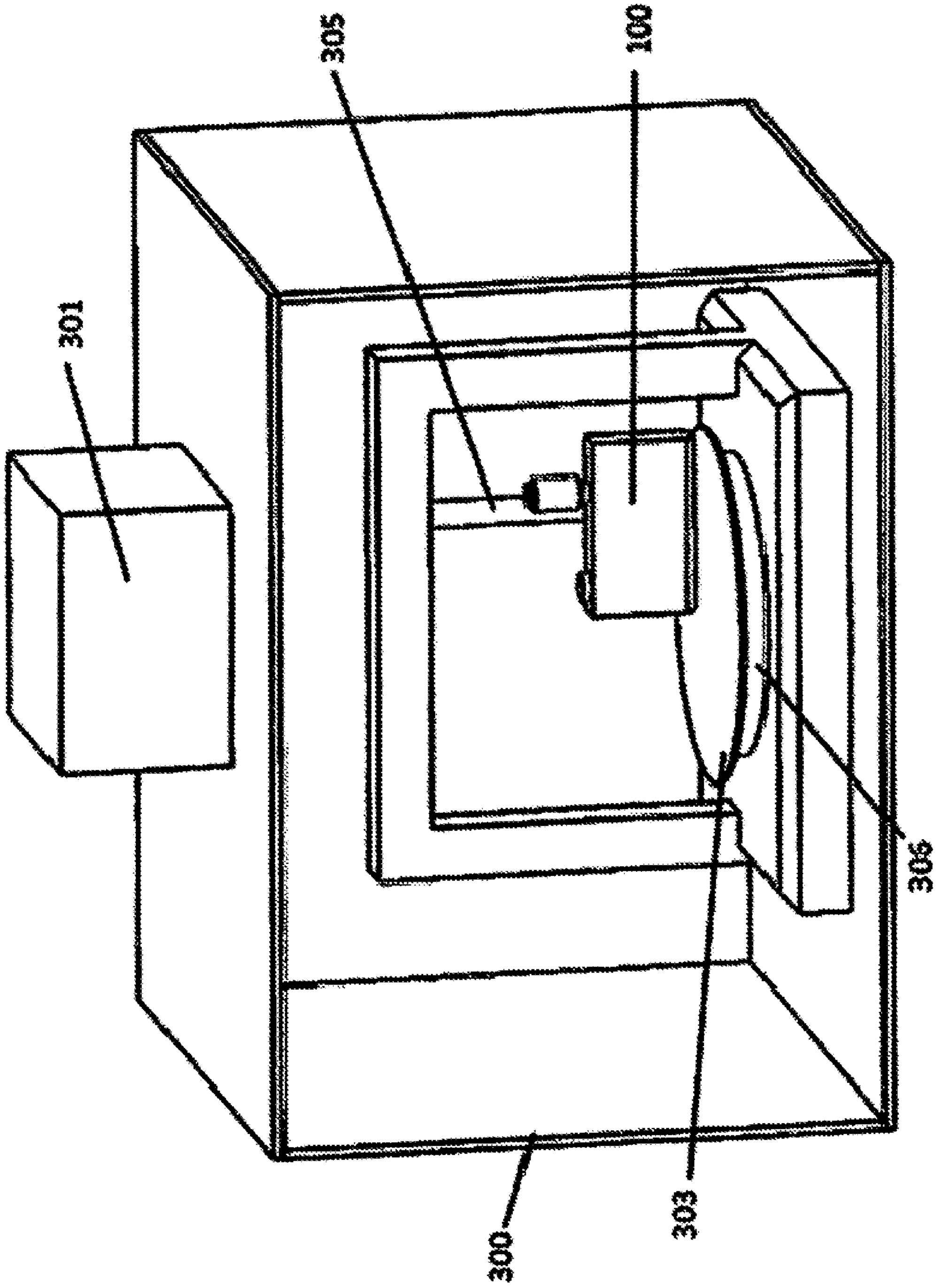
FIG. 2 is a schematic diagram of an exemplary apparatus embodiment of the invention, in which the substrate wafer is rotated underneath a stationary plasma device.

FIG. 2 shows a schematic of another exemplary apparatus for plasma processing of electronic materials, in a way that is free of the deposition of substantial numbers of particles on the substrate. The apparatus includes an enclosure 300, a gas filtration system 301, a plasma device 100, and a substrate 303. The plasma device 100 is mounted on a fixture 305 that keeps the outlet of the device 100 at a fixed distance from the substrate 303 between 1.0 and 10.0 mm. The substrate 303 is placed on a spinning stage 306. The plasma device is configured so that the outlet plasma beam extends over the radius of the circular substrate. During plasma processing, the substrate is spun underneath the beam at speeds ranging from 1 to 10,000 rpm.

Figure 3A:
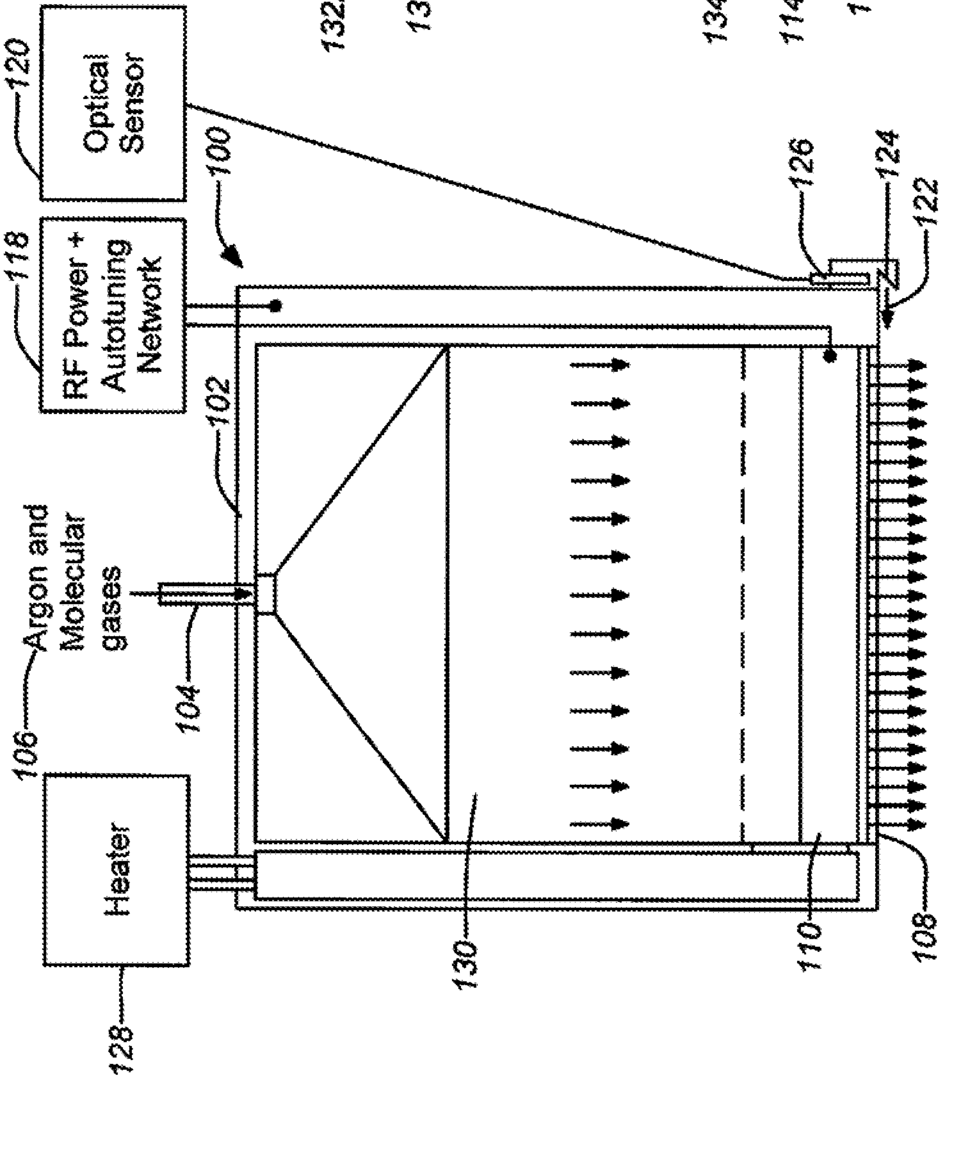
FIGS. 3A and 3B show cross sections of an example argon plasma device.
Figure 3B:
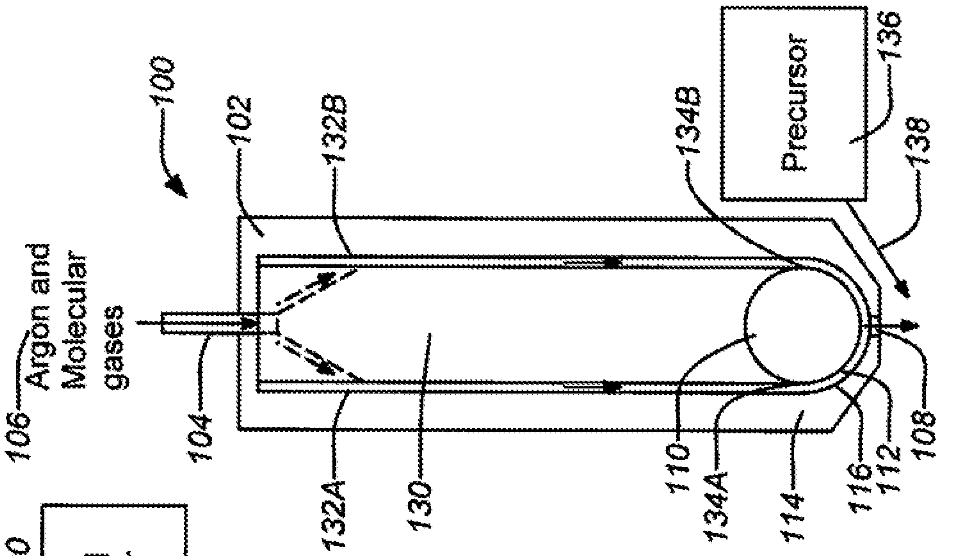

FIGS. 3A and 3B are schematic cross-section diagrams of an exemplary argon plasma device 100 according to an embodiment of the invention for producing a low-temperature, atmospheric pressure argon plasma. The device 100 comprises a housing 102 which supports an inlet 104 for gas flow comprising argon and one or more molecular gases 106 and an outlet 108 for argon plasma comprising reactive neutral species. Typically, the molecular gas is added to the argon gas flow at a concentration between 0.1 to 5.0 volume %. The molecular gas dissociates into atoms (O, N, H, F, C or S atoms) inside the argon plasma and then flows out of the outlet, e.g. onto a substrate. In this example, the outlet 108 comprises a linear opening.

A flow path within the housing 102 directs the gas flow to become laminar as it moves from the inlet 104 toward a power electrode 110. The power electrode 110 disposed within the housing has a powered electrode surface 112 exposed to the laminar gas flow. A ground electrode 114 is disposed adjacent to the power electrode 110 such that a grounded electrode surface 116 is closely spaced from the powered electrode surface and the laminar gas flow is directed there between. In this example, the entire housing 102 is the ground electrode 114. However, those skilled in the art will understand that the ground electrode 114 can be implemented as a separate component in the region near the grounded electrode surface 116. It is only necessary that the power and ground electrodes 110 and 114 are electrically isolated from one another as will be readily understood by those skilled in the art.

A power supply 118 for delivering radio frequency power is coupled to both the power electrode and the ground electrode to ionize the laminar gas flow and produce the argon plasma comprising the reactive neutral species as it passes between the electrode surfaces 112, 116. In addition, a heater 128 may or may not be coupled to the device 100 for heating one or both of the power electrode 110 and the ground electrode 114 as the laminar gas flow is directed between the surfaces 112, 116. The heater 128 heats to a temperature between 4° and 200° C., but preferable between 4° and 80° C. Heating can be implemented through any suitable means however, in the example device 100, the heater 128 comprises heated liquid circulated through a hollow space within the power electrode 110. Further details for operating a power supply and heater in a suitable plasma delivery device for implementing an embodiment of the invention can be found in U.S. Pat. Nos. 9,406,485 and 10,032,609, which are both incorporated by reference herein.

The powered electrode can be coated with a non-metallic, non-conducting material between 1 and 100 microns thick. The dielectric coating on the power electrode can be a hard, high temperature, non-porous coating, including glass ($SiO_2$), alumina ($Al_2O_3$), aluminum nitride (AlN), or similar inorganic electrical insulator. Note that reference to the "powered electrode surface" is still applicable if such a coating exists on the power electrode; direct physical contact between the conducting electrodes and the gas flow is not required as will be understood by those skilled in the art.

The example device 100 may employ an optical sensor for receiving optical spectroscopy information of the argon plasma comprising the reactive neutral species at the outlet 108. In this example, the optical spectroscopy information is from a line of sight 122 along the linear opening of the outlet 108 allowing for measurement of the plasma afterglow. In addition, the device 100 employs a mirror 124 at one end of the linear opening for reflecting the optical spectroscopy information into the fiber optic feed 126 to the sensor 120. Further details for operating an optical sensor to capture optical spectroscopy information in a suitable plasma delivery device for implementing an embodiment of the invention can be found in U.S. Pat. Nos. 9,406,485 and 10,032,609, which are both incorporated by reference herein.

In the device 100, the flow path is formed by a laminar flow insert 130 disposed within the housing 102. The laminar flow insert 130 directs the gas flow from the inlet 104 to two opposing walls 132A, 132B of the chamber (while spreading each half of the gas flow to be the width of the outlet 108) and then to two opposite sides 134A and 134B of the powered electrode surface 112. The flow insert can be manufactured of a high temperature, insulating material that is resistant to plasma etching including thermoplastics, including PEEK, perfluoroelastromers, Kalrez, Viton, fluoropolymers, Teflon, or alumina and other ceramics. The power electrode surface 112 comprises part of a cylindrical surface and the laminar gas flow is directed circumferentially along the part of the cylindrical surface toward the outlet 108. In this case the bifurcated gas flow converges at the outlet 108 as plasma after being ionized between the electrode surfaces 112 and 116. Further details for using a flow insert in a suitable plasma delivery device for implementing an embodiment of the invention can be found in U.S. Pat. Nos. 9,406,485 and 10,032,609, which are both incorporated by reference herein.

The power supply 118 can also include an auto-tuning network that impedance matches the radio frequency power supply to the argon plasma. In addition, the auto-tuning network follows a logic algorithm that drives towards a forward power set point while minimizing reflected power, and does so as the argon plasma moves from strike conditions at a higher voltage to run conditions at a lower voltage. For example, 50-ohm impedance matching can be employed. Further details for operating an auto-tuning network in a suitable plasma delivery device for implementing an embodiment of the invention can be found in U.S. Pat. Nos. 9,406,485 and 10,032,609, which are both incorporated by reference herein.

Finally, the plasma device 100 can also be utilized with a precursor device 136 external to the housing 102. The precursor device 136 introduces a linear beam 138 of volatile chemical precursor(s) into the reactive plasma flow near the outlet 108, e.g. so as to enable the deposition of a thin film onto a substrate placed a short distance downstream. The shape of the precursor outlet can match that of the plasma outlet. For example, for a 4" linear plasma source outlet, the precursor outlet is also a 4" slit, but oriented such that the gas exiting from the precursor outlet enters into the plasma gas stream exiting the source (e.g. can be perpendicular to, or at 45 degrees to it, etc.). Typical chemical precursors include tetraethyl-orthosilicate, tetramethyl-cyclotetrasiloxane, trimethylsilane, and other organosilanes or organometallics.

The example device 100 may be further modified or used in process according to the detailed examples in the following sections as will be understood by those skilled in the art. Some example, applications for the devices and methods described herein include, without limitation, cleaning a material surface, activating a material surface for wetting, activating a material surface for adhesion, depositing a thin film onto the substrate, depositing a thin glass film onto the substrate, etching a thin layer of material off of a substrate, and etching a metal oxide layer, including copper oxide, off of a substrate.

Methods of Plasma Processing of Electronic Materials without Particle Contamination.

The invention is further embodied by methods of processing electronic materials without significant contamination of the substrate with particles. The reactive gas exits the argon plasma apparatus as described in FIGS. 3A and 3B and impinges on a substrate where cleaning, activation, etching, and/or deposition take place. The low-temperature, atmospheric pressure argon plasma device generates the reactive gas flow without adding substantially any particles to the gas steam. The radio frequency power applied to the closely spaced electrodes, 110 and 114, generates a capacitive discharge without substantially any streamers, micro-arcs, or sparks. The capacitive discharge has a protective sheath next to the electrode surfaces, 112 and 116. Ions entering the sheath undergo many collisions, and lose their excess kinetic energy before striking the electrode surface. This prevents sputtering of the surface with ejection of particulate matter into the gas stream.

Embodiments of the invention can be practiced with a mixture of argon and other molecular gases at concentrations up to 5.0 volume %. Depending on the desired application, the molecular gas may be oxygen, nitrogen, hydrogen, methane, carbon tetrafluoride ($CF_4$), octafluorobutane ($C_4F_8$), nitrogen trifluoride ($NF_3$), sulfur hexafluoride ($SF_6$), ammonia, water, hydrocarbons with carbon-carbon chain lengths from 2 to 6, and other molecules that would be obvious to those skilled in the art. The temperature of the gas exiting the plasma source generally ranges from 40 to 80° C., although temperatures higher than 80° C. may be used, depending on the particular embodiment of the invention. The temperature of the substrate is important for the desired process, and this can be independently adjusted by the temperature of the fluid recirculating through the plasma housing, or by a separate heater placed underneath the substrate.

Examples are given below of methods of processing materials without depositing substantial numbers of particles on the substrate. These examples are not intended to limit the embodiments of the invention, but to illustrate methods in which they can be practiced. The apparatus and methods of the invention may be used for many other purposes, which will be understood by those skilled in the art.

Example 1

Apparatus and Method of Cleaning a Substrate

The atmospheric pressure argon plasma may be used to remove organic compounds from surfaces, thereby cleaning the substrate. The method of cleaning surfaces is accomplished by flowing argon gas containing reactive molecules through the plasma to convert the molecules into atoms and other reactive species. This gas flow, that is free of a substantial number of particles, is directed onto the surface to be cleaned. The contaminated surface is exposed to the reactive species generated in the plasma for a sufficient period of time to cause organic contamination to be removed without damage to it. A sufficient period of time can be an exposure to the reactive gas for 0.1 second to 1.0 hour, and generally in the range of 1.0 second to 1.0 minute. Since the atmospheric plasma may be scanned over the surface, the total treatment time may be longer than the aforementioned time periods for especially large substrates. Moreover, it may be advantageous for the contaminated surface to be scanned with the argon plasma device multiple times, but each time without the addition of substantial numbers of particles.

Gas molecules that are suitable for embodiments of the invention include, but are not limited to, oxygen, hydrogen, carbon dioxide, carbon monoxide, nitrogen, nitrous oxide, ammonia and water. These molecules may be converted into atoms, ions or metastable molecules that are effective for surface cleaning. Oxygen containing gas molecules, including $O_2$, $CO_2$, and $NO_2$, are particularly well suited for embodiments of the invention, because they may be converted into ground-state O atoms, which among other beneficial properties, are effective at etching away organic contamination, but do not react with inorganic surfaces. Atmospheric pressure plasmas suitable for embodiments of the invention include those that generate a high concentration of ground-state atoms, radicals, or metastable molecules downstream of the plasma zone, but without the addition of particles to the gas stream, most likely caused by energetic ion bombardment of electrode surfaces.

An example embodiment of the invention was carried out on silicon wafers 200 millimeters (mm) in diameter. The self-contained plasma housing was mounted on a scanning robot and placed inside a class 100 cleanroom (refer to the drawing in FIG. 1 for the experimental setup). The class 100 cleanroom contained no more than 100,000 particles larger than 0.1 micron in size per cubic meter of air. The silicon wafers were obtained directly from the vendor without any further cleaning. They had a thin native oxide layer on their surfaces. Each wafer was placed onto the robot stage and scanned with the low-temperature, atmospheric pressure argon plasma. The outlet slit for the reactive gas to flow out of the plasma source was 100 mm in width. The distance between the outlet slit and the 200 mm silicon wafer was approximately 3 mm. In each experiment, the robot scanned the plasma source over one half of the wafer, then stepped it 100 mm to the right, and scanned it over the second half of the silicon wafer in the opposite direction. Different scan speeds were used ranging from 25 to 300 mm/s. The 100 mm linear beam plasma source was fed with 40.0 liters per minute (LPM) of argon and 0.32 LPM of oxygen, i.e., 0.8% $O_2$ in argon. Radio frequency power in the amount of 550 W at 27.12 MHz was supplied to the plasma source.

Shown in Table 1 is a summary of the results obtained for processing 200 mm silicon wafers with a standard vacuum plasma and with an example embodiment of the invention (as described in the preceding paragraph). After processing the silicon wafers, they were tested with a Krüss Mobile Surface Analyst (MSA). This device determines the surface energy and the water contact angle (WCA). A native oxide on silicon contaminated with organic compounds will have a surface energy well below 77.8 milli-Newton/meter (mN/m), and WCA above 30°. The first test was to remove the Si wafer from a plastic storage container and examine it with the MSA in the class 100 cleanroom. These results are presented in the first line in the Table. One sees that the surface energy was 64.2 mN/m and the water contact angle was 37.9°. After treating a wafer for 2 minutes (120 seconds) in the vacuum oxygen plasma, the surface energy was 77.0 mN/m and the WCA was 6.7°. Treatment with the low-temperature, atmospheric pressure argon and oxygen plasma at scan speeds ranging from 25 to 200 mm/s yielded identical results within the experimental error of the measurement. The surface energy was 77.7±0.1 mN/m and the WCA was 6.4±0.8 degrees. Only at the highest scan speed of 300 mm/s was a slightly lower surface energy achieved. These results demonstrate that the organic contamination on the native oxide surface can be completely removed with the atmospheric argon and oxygen plasma at scan speeds of 200 mm/s. The total process time for cleaning the 200 mm silicon wafer was approximately 2.5 seconds, which is 48 times faster than the vacuum plasma treatment. This same process has been applied to 300 mm silicon wafers. The total process time for cleaning a 300 mm silicon wafer was approximately 5.5 seconds.

TABLE 1

Comparison of vacuum plasma cleaning to atmospheric pressure argon and oxygen plasma cleaning of 200 mm silicon wafers.

| Treatment | Scan Speed (mm/s) | Process Time (s) | Surface Free Energy (mN/m) | Water Contact Angle (*) |
|---|---|---|---|---|
| Cleanroom exposure only | N/A | 60 | 64.2 | 37.9 |
| Vacuum $O_2$ plasma | N/A | 120 | 77.0 | 6.7 |
| Atmospheric Ar—$O_2$ plasma | 25 | 20 | 77.7 | 6.5 |
| Atmospheric Ar—$O_2$ plasma | 50 | 10 | 77.8 | S.S |
| Atmospheric Ar—$O_2$ plasma | 100 | 5 | 77.8 | 6.1 |
| Atmospheric Ar—$O_2$ plasma | 200 | 2.5 | 77.6 | 7.3 |
| Atmospheric Ar—$O_2$ plasma | 300 | 1.7 | 76.8 | 10.3 |

Particle detection on the wafer surface was performed with a light scattering tool. This tool uses a laser beam that scans over the Si wafer. Any particles present on the surface will scatter the incident light. By measuring the reflected light, it is possible to map out the number, size and location of the particles on the substrate. In this way, the unexpected results of the invention can be revealed.

Figure 4:
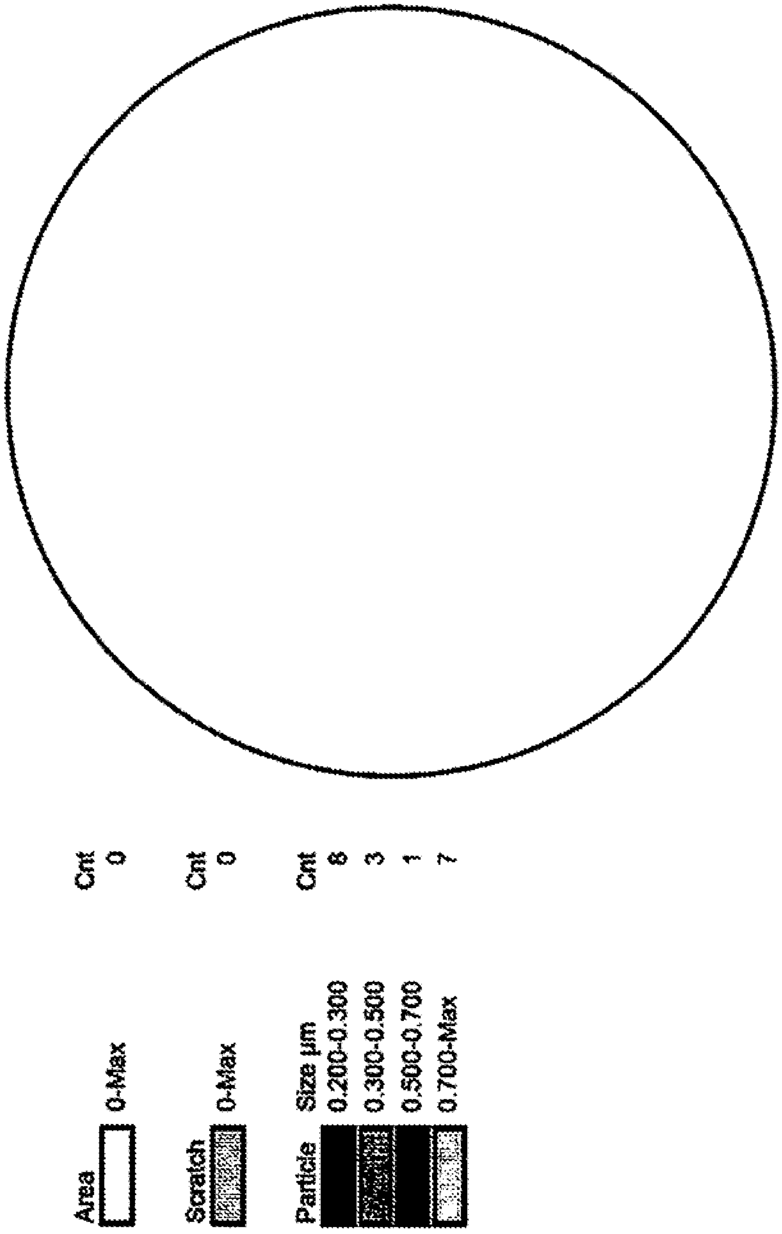
FIG. 4 is a depiction of the particle map for a silicon wafer in the cleanroom.
Figure 5:
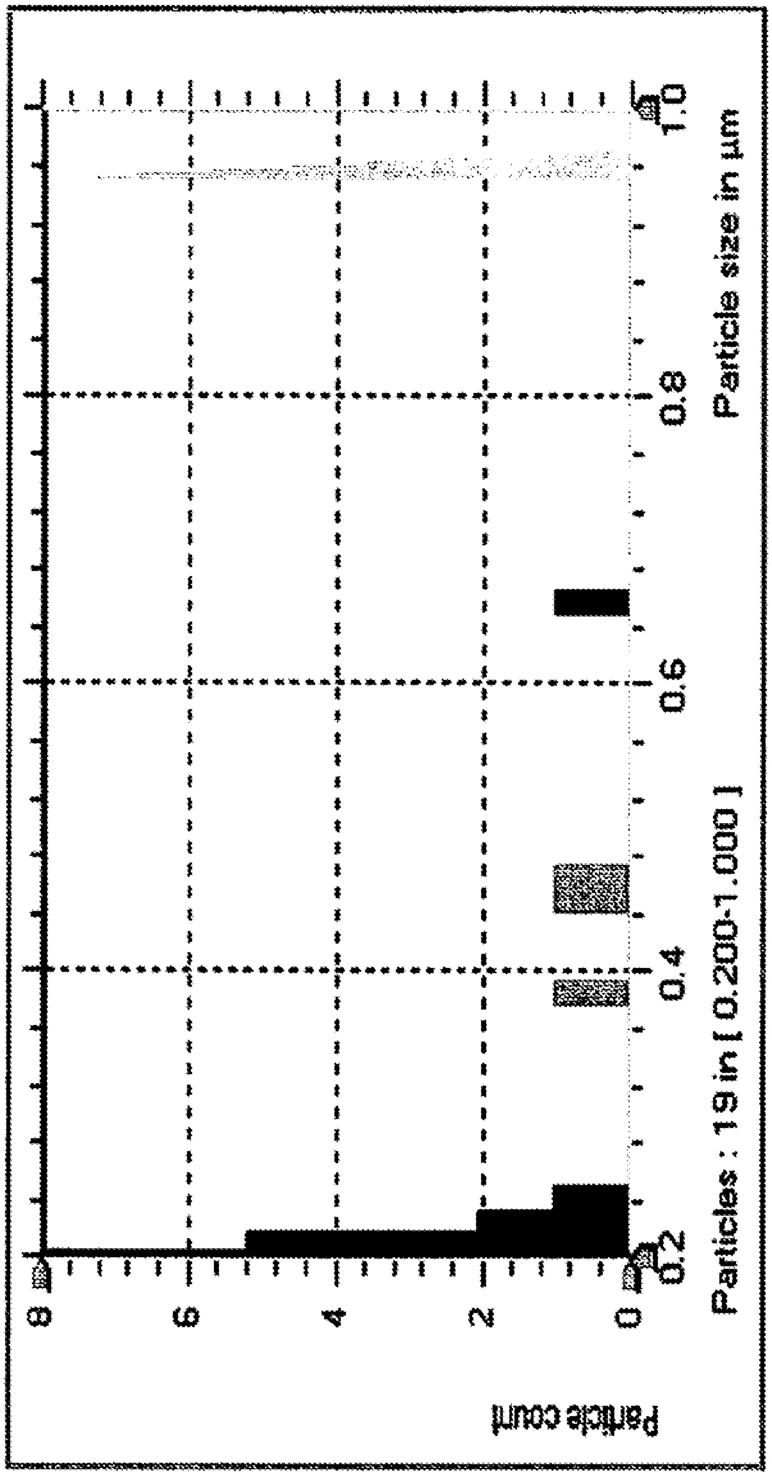
FIG. 5 is a histogram of the particle size distribution on the silicon wafer exposed to the cleanroom.

Presented in FIG. 4 is a particle map of the silicon wafer after it was exposed to the cleanroom environment only. The particle detection apparatus shows a total of 19 particles on the wafer surface. FIG. 5 shows the particle size distribution on the Si wafer. The 19 particles detected on the surface include 8 particles between 0.2 and 0.3 microns (μm) in size, 3 particles between 0.3 and 0.5 microns in size, 1 particle between 0.5 and 0.7 microns in size, and 7 particles between 0.7 and 1.0 micron in size.

Figure 6:
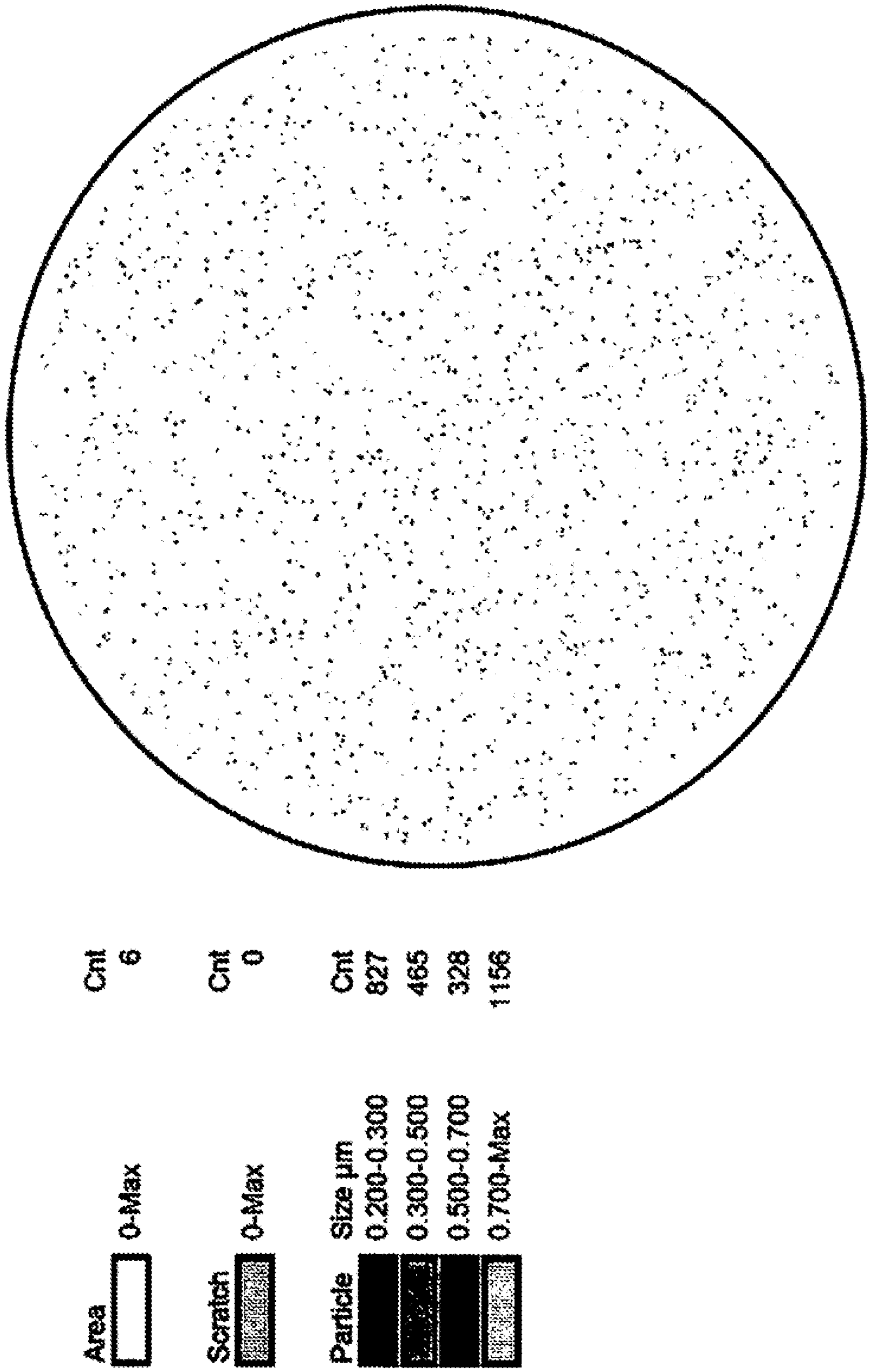
FIG. 6 is a depiction of the particle map on a silicon wafer after cleaning with the vacuum oxygen plasma.
Figure 7:
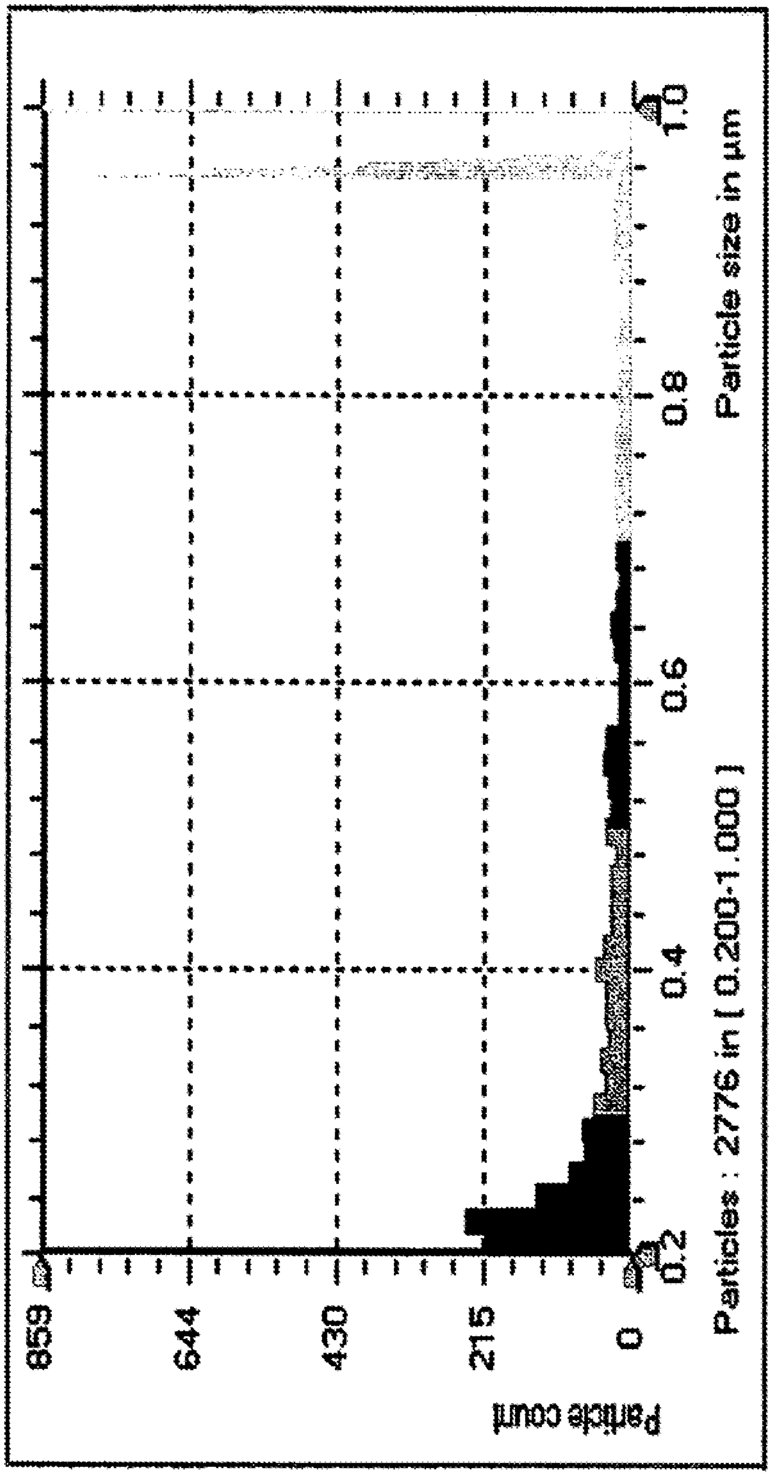
FIG. 7 is a histogram of the particle size distribution on the silicon wafer exposed to the vacuum $O_2$ plasma.

FIG. 6 shows the particle map on a silicon wafer which was obtained after cleaning the surface with a prior art vacuum oxygen plasma. The laser scattering instrument detected a total of 2,776 particles on the wafer surface after processing. The number of particles present on the wafer surface has produced a surface with a 146-fold increase in particle counts. FIG. 7 shows a histogram of the particle size distribution on the Si wafer. The 2,779 particles detected on the surface include 827 particles between 0.2 and 0.3 μm in size, 465 particles between 0.3 and 0.5 μm in size, 328 particles between 0.5 and 0.7 μm in size, and 1,156 particles between 0.7 and 1.0 μm in size.

The vacuum plasma adds many thousands of particles to the wafer, and it necessitates a subsequent wet cleaning step to remove these particles before further processing can occur, including, but not limited to, fusion bonding. Complicated and costly modifications can be made to the vacuum plasma to reduce the number of particle adders, but these modifications will not completely eliminate them (see, for example, G. S. Selwyn, Jpn. J. Appl. Phys. 32, 3068 (1993)).

Figure 8:
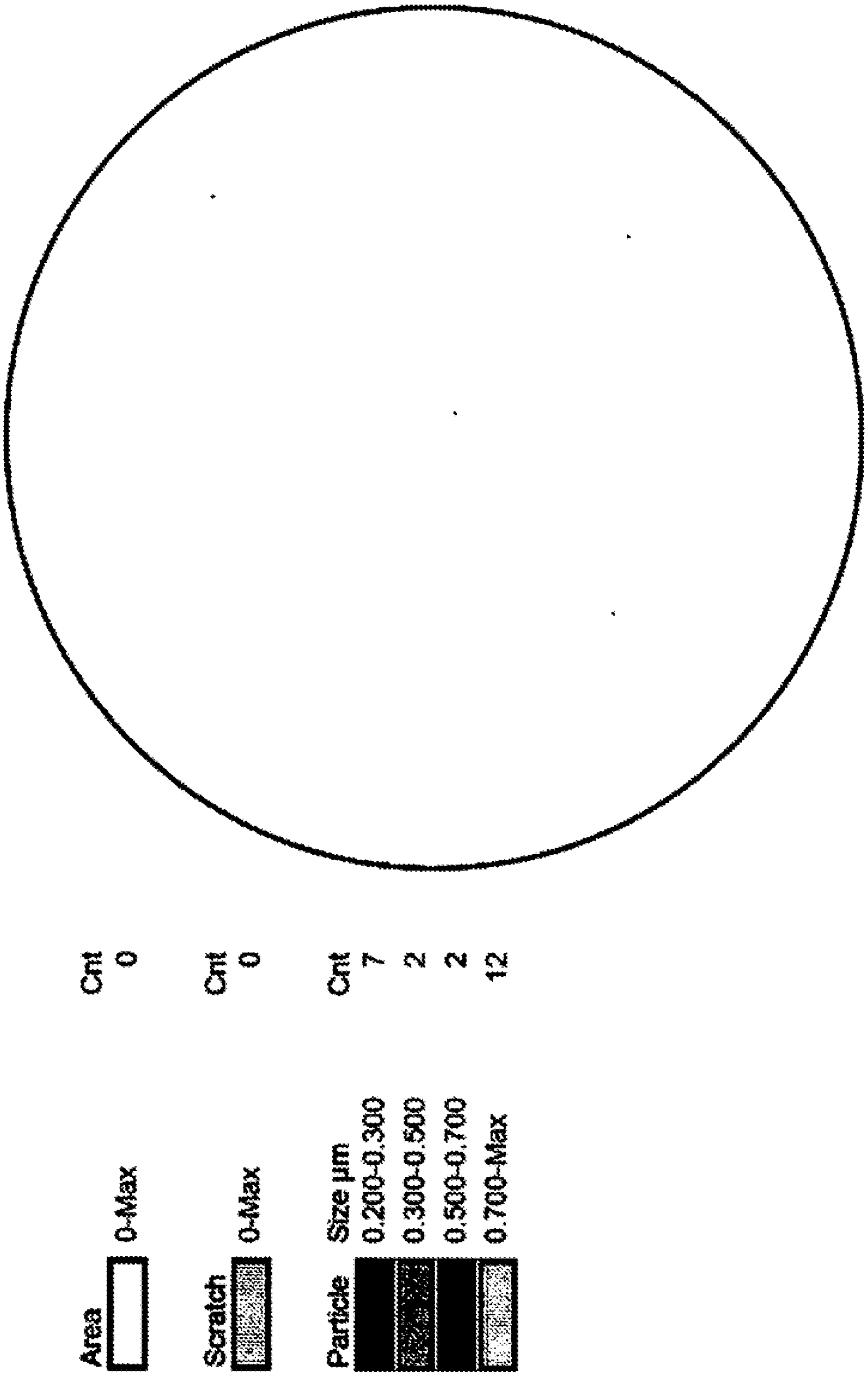
FIG. 8 is a depiction of the particle map on a silicon wafer after cleaning with atmospheric pressure argon and oxygen plasma.
Figure 9:
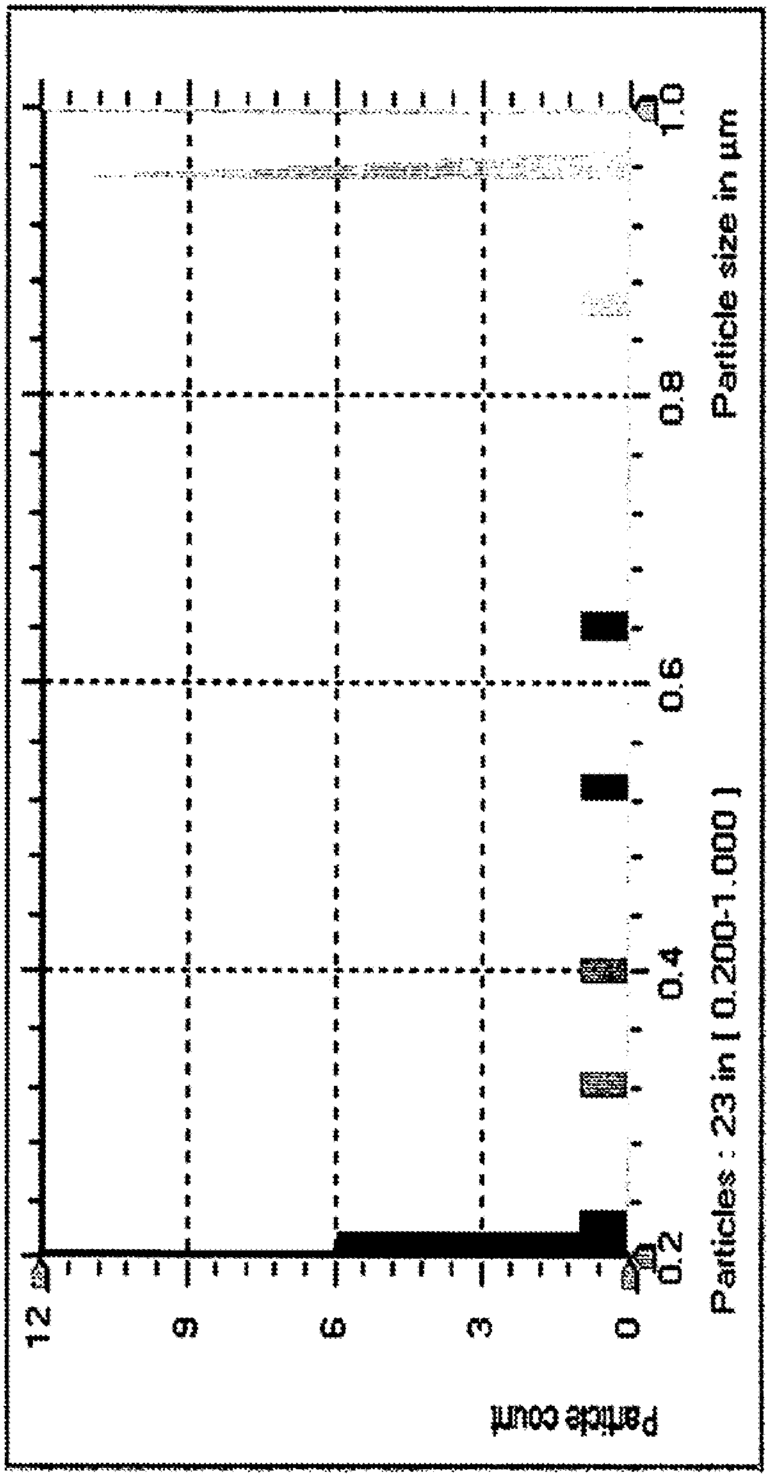
FIG. 9 is a histogram of the particle size distribution on the silicon wafer exposed to the atmospheric pressure $Ar/O_2$ plasma.

FIG. 8 shows the particle map obtained on a silicon wafer after cleaning it with the apparatus depicted in FIG. 1. The atmospheric pressure, argon and oxygen plasma scanned over the 200 mm Si wafer at a speed of 200 mm/s, yielding a total process time of 2.5 seconds. The laser light scattering instrument shows a total of 23 particles on the substrate surface. A histogram of the particle distribution is presented in FIG. 9. The 23 particles detected on the surface include 7 particles between 0.2 and 0.3 μm in size, 2 particles between 0.3 and 0.5 μm in size, 2 particles between 0.5 and 0.7 μm in size, and 12 particles between 0.7 and 1.0 μm in size.

It is evident that embodiments of the invention can yield an unexpected improvement over the prior art. Total particle count and the particle size distribution are summarized in Table 2 below. The embodied invention, labeled as "Surfx $Ar/O_2$ plasma" adds only 4 total particles when compared to the silicon wafer exposed only to the cleanroom environment. The vacuum $O_2$ plasma well known in the prior art adds 2,757 particles over that from the cleanroom. The ratio of these two values demonstrates that the embodied invention is 689 times cleaner than the prior art process.

TABLE 2

Summary of particle counts measured after plasma processing silicon wafers.

| Product | Particle Count 0.2-0.3 microns | 0.3-0.5 microns | 0.5-0.7 microns | 0.7-1.0 microns | Total particles |
|---|---|---|---|---|---|
| Cleanroom only | 8 | 3 | 1 | 7 | 19 |
| Vacuum $O_2$ plasma | 827 | 465 | 328 | 1,156 | 2,776 |
| Surfx $Ar/O_2$ plasma | 7 | 2 | 2 | 12 | 23 |
| Additional particle ratio vacuum/Surfx: | | | | | 689 |

This example is only intended to illustrate one way in which the invention may be practiced. This particle-free plasma cleaning process has many useful applications, including, but not limited to, wafer level packaging. Packaging at the wafer level enables the stacking of multiple devices onto a single substrate. This can significantly increase the functionality and complexity of integrated circuits without greatly increasing their production costs. Microelectronic devices are becoming ever more complex with higher levels of integration, higher operating frequencies, more functionality, and increased performance, Three-dimensional chips, obtained through wafer level packaging, are a promising approach to achieving these goals.

One of the main methods for producing 3D chips is fusion bonding. In fusion bonding, two ultra-smooth (<10 Å roughness) wafers are fused together without using adhesives or an external force. This technique requires surface preparation by one of a few methods: 02-based plasma, hydration, or dipping in a hydrofluoric acid solution. After cleaning, placing two wafers one on top of the other, leads to hydrogen bonding between the cleaned and oxidized surfaces. Annealing at 600-1200° C. drives water out of the interfacial region and chemically fuses the wafers together through oxygen bridge bonding. This process requires a scrupulously clean surface because the presence of any particles or physical debris will inhibit intimate contact between the substrates, and thereby prevent the formation of hydrogen bonds across the interface. The apparatus and method described in this example is an advantageous way to clean the surface prior to fusion bonding.

Another application that will benefit from the invention is glass frit bonding, which is widely used to cap and seal micro-electromechanical systems on the wafer level. Glass frit bonding, also referred to as glass soldering, or seal glass bonding, describes a wafer bonding technique with an intermediate glass layer. The glass layers must be cleaned and activated for bonding without becoming contaminated with particles. The atmospheric pressure, argon and oxygen plasma has several advantages over the vacuum oxygen plasma in this application, including faster processing speeds, and the avoidance of particle deposition onto the substrate.

Many methods of producing electronic materials require atomically clean and particle-free surfaces. The above descriptions of wafer level packaging and glass frit bonding are several examples. Other examples would be obvious to those skilled in the art.

Example 2

An example embodiment of the invention was carried out on silicon wafers 200 mm in diameter. The self-contained plasma housing was mounted on a scanning robot and placed inside a hood that contained a filter fan unit, and the entire apparatus was set up in a class 100 cleanroom. The silicon wafers were obtained directly from the vendor and were dipped in an RCA-SC-1 cleaning solution, rinsed with deionized water, and then dried. The RCA SC-1 solution consisted of 5 parts of deionized water, 1 part of ammonia in water, 29% $NH_3$ by weight, and 1 part of aqueous hydrogen peroxide, 30% $H_2O_2$ by weight. After cleaning, there was a thin native oxide layer on the silicon wafer surfaces. Each wafer was placed onto the robot stage and scanned with the low-temperature, atmospheric pressure argon plasma. The outlet slit for the reactive gas to flow out of the plasma source was 100 mm in width. The distance between the outlet slit and the 200 mm silicon wafer was approximately 4 mm. In each experiment, the robot scanned the plasma source over one half of the wafer, then stepped 100 mm to the side, and scanned the source over the second half of the silicon wafer in the opposite direction. After processing, the water contact angle and surface free energy were measured with the Kruss Mobile Surface Analyst (MSA), while the particle counts on the wafer were measured with a KLA-Tencor model XXX scanner.

FIG. 12 shows Table 3 which is a summary of the results obtained for processing 200 mm silicon wafers with the atmospheric pressure, argon and oxygen plasma. The samples were treated with the 100 mm linear plasma beam at RF power levels of 500 and 300 W, offset distances of 2 and 6 mm, and scan speeds between 25 and 150 mm/s. The offset is the distance between the exit of the plasma housing and the surface of the 200 mm silicon wafer. The first test was to place the Si wafer on the robot stage for 1 minute and then transfer it to the instruments for recording the water contact angle (WCA), surface free energy (SFE) and particle counts. The WCA and SFE measured with the MSA was 40° and 63 mN/m, and the number of particles above 0.1 micron in size was 28. Next, a fresh wafer was scanned with the argon and oxygen plasma at 500 W, offset of 2 mm, and scan speed of 25 mm/s. The WCA, SFE and particle counts were 4°, 77 mN/m, and 29, respectively (this is the "after" state). By comparison, the particle counts on a fresh wafer taken out of the cassette was 10 (this is the "before" state). This suggests that 19 particles were added by the treatment. However, measuring particle count on fresh wafers over and over (the "before" state) revealed that the particle counts can range from 10 to 30. Therefore, any counts less than 30 may be interpreted as not adding particles to the silicon wafer, within the error of the measurement. In other words, the plasma process is particle free.

Further examination of Table 3 reveals that the atmospheric pressure, argon and oxygen plasma treatment fully activates the silicon surface, yielding a water contact angle less than 10° and a surface free energy of 77 mN/m. The only process conditions that may have given a slightly less active surface is the one carried out at 300 W and a scan speed of 150 mm/s. Here a WCA of 8° was recorded. Inspection of the particle counts reveals that at an RF power of 300 W and scan speed of 25 mm/s, the number of particle adders was 19 and 30. For all other process conditions tested the number of particle adders was 10 or less.

FIG. 13 shows Table 4 which presents the results for treating the 200 mm silicon wafers with the atmospheric pressure, argon and hydrogen plasma. In these embodiments, the 100 mm plasma head was used with an RF power of 500 or 300 W, and argon gas flow containing 1.0% hydrogen. The offset distance was changed from 2 to 6 mm, and the scan speed was varied from 25 to 100 mm/s. For all the experiments where the offset distance was 2 mm, the silicon surface was fully activated by the hydrogen plasma, yielding a water contact angle of 2° and a surface free energy of 77 or 78 mN/m. In the one case where the offset distance was increased to 6 mm, with 500 W RF power and 25 mm/s scan speed, the silicon surface was not fully activated, yielding a WCA of 17°. For every test performed, the number of particle adders was below 30, indicating that the atmospheric pressure, argon and hydrogen plasma was able to activate the silicon wafers while maintaining a particle free condition.

If other process conditions are used which do not follow the recipes described above, such as supplying the wrong gas to the plasma, or scanning too close and too slow over the materials substrate, then many particles may be deposited on the surface.

Example 3

Apparatus and Method of Etching a Substrate

Another embodiment of the invention is etching of materials, including glass, metals, metal oxides and polymer films, wherein particles are not deposited on the substrate during the etching process. For example, organic films may be etched by exposure to the atmospheric pressure, argon and oxygen plasma mounted inside the particle-free enclosure. Glasses, metals and metal oxides may be etched by exposure to the afterglow from the atmospheric pressure plasma apparatus fed with mixtures of argon and halogen-containing molecules, including, but not limited to, nitrogen trifluoride, carbon tetraflouride, and sulfur hexaflouride. Further details for operating a suitable plasma delivery device for etching materials in an embodiment of the invention can be found in U.S. Pat. Nos. 9,406,485 and 10,032,609, which are both incorporated by reference herein.

In an embodiment of the invention, metal oxide materials are etched away through a hydrogen reduction process. For example, a flux of hydrogen atoms is generated in the plasma by feeding hydrogen gas mixed with argon. A metal or semiconductor substrate is placed downstream of the plasma discharge, so that only ground-state hydrogen atoms and neutral species impinge on the sample surface. These hydrogen atoms rapidly react with the metal oxide surface to generate a clean metal surface and water vapor as a byproduct. Embodiments of the invention allow for unwanted oxides to be removed from live electronic devices while avoiding ion bombardment and electrical arcing, which may damage the substrate. An alternative method of removing oxide layers from metals is to carry out this process in open air, where the plasma source generates a large flux of neutral hydrogen atoms allowing for rapid oxide removal, and eliminating any unwanted side reactions with the ambient air.

One embodiment of the invention is a method of removing copper oxide from copper using the atmospheric pressure plasma fed with argon and a forming gas mixture of hydrogen and nitrogen. This embodiment was demonstrated on copper lead frames that are used in the semiconductor industry. The copper substrates were placed on a hot plate and heated to 180° C. At this temperature, a copper oxide film spread over the surface, which exhibits a characteristic purple color. Process gas containing a mixture of 15.0 L/min argon and forming gas at 1.0 L/min (95% nitrogen and 5% hydrogen) was fed to the one-inch-linear plasma source at atmospheric pressure. This plasma source produces a linear beam of reactive gas 25 mm wide. Radio frequency power at 160 W was applied to the electrodes, causing the plasma to be ignited and sustained. The plasma source was then mounted 2 to 3 mm above the oxidized copper surface. During exposure to the outlet gas flow from the argon and hydrogen plasma, the purple copper oxide film was removed, leaving behind a shiny metallic copper surface. Further details for removing copper oxide with an embodiment of the invention can be found in U.S. patent application Ser. No. 16/042,905, which is incorporated by reference herein.

An additional embodiment of the invention is a method to reduce copper oxide using atmospheric pressure plasma fed with a mixed gas of argon and hydrogen without the presence of nitrogen from a forming gas mixture. The copper lead frames were first oxidized using a forced convection oven operating between 200 and 250° C. for a duration of 5, 10, 20 and 30 minutes. After 5 minutes, the copper metal exhibits a reddish-brown color indicating an oxide layer thickness of 25 nm. Table 5 summarizes the color and corresponding oxide thickness at each time interval in the oven.

TABLE 5

Summary of thermally grown copper oxide thickness and corresponding color.

| Time in Oven (min) | Surface Color | Oxide Thickness (nm) |
|---|---|---|
| 5 | Red/Brown | 25 |
| 10 | Purple/Blue | 30 |
| 20 | Pale Blue | 60 |
| 30 | Yellow/Gold | 100 |

Copper oxide etching was performed at ambient temperature and pressure using a 1-inch (25 mm) linear plasma head fed with a gas mixture containing 1.0% hydrogen in argon. The plasma was driven with at 150 W of radio frequency (RF) power at 27.12 MHz. The plasma head outlet was placed 1 to 2 mm away from the sample and scanned over it at speeds between 0.5 and 2.0 mm/s, depending on the oxide layer thickness. A 50 nm thick copper oxide layer was reduced to metallic copper with a single pass treatment at a scan speed of 2.0 mm/s. Complete removal of a 100 nm thick copper oxide layer was achieved by scanning the argon and hydrogen plasma over the surface at 0.5 mm/s.

The embodied invention can consist of an apparatus that measures the thickness of the copper oxide on a sample, using for example, the color of the copper substrate, and then determines the appropriate plasma head scan speed based upon the time needed to reduce the oxide layer back to copper metal. In addition, surface oxides of a non-uniform thickness which may be encountered in semiconductor and electronics manufacturing can be reduced to bare copper metal at low temperature and high throughput with no warping or damage to electronic packages, such as those containing lead frames, copper wires and bond pads, and dies with copper bond pads.

The copper oxide etch rate is a function of the substrate temperature during the plasma reduction process. Two methods can be used to increase the copper substrate temperature. The first is to suspend the copper sample in air, or a non-oxidizing gas, such as argon or nitrogen, using thermally insulating material to hold the sample at the edges. This method reduces thermal conduction away from the substrate material thereby allowing localized heating of the sample to build up rather than be dissipated away. In this case, the plasma gas is the source of heating the substrate. Another embodiment of the invention is to use an external heat source placed under the suspended sample to control the substrate temperature.

Figure 10:
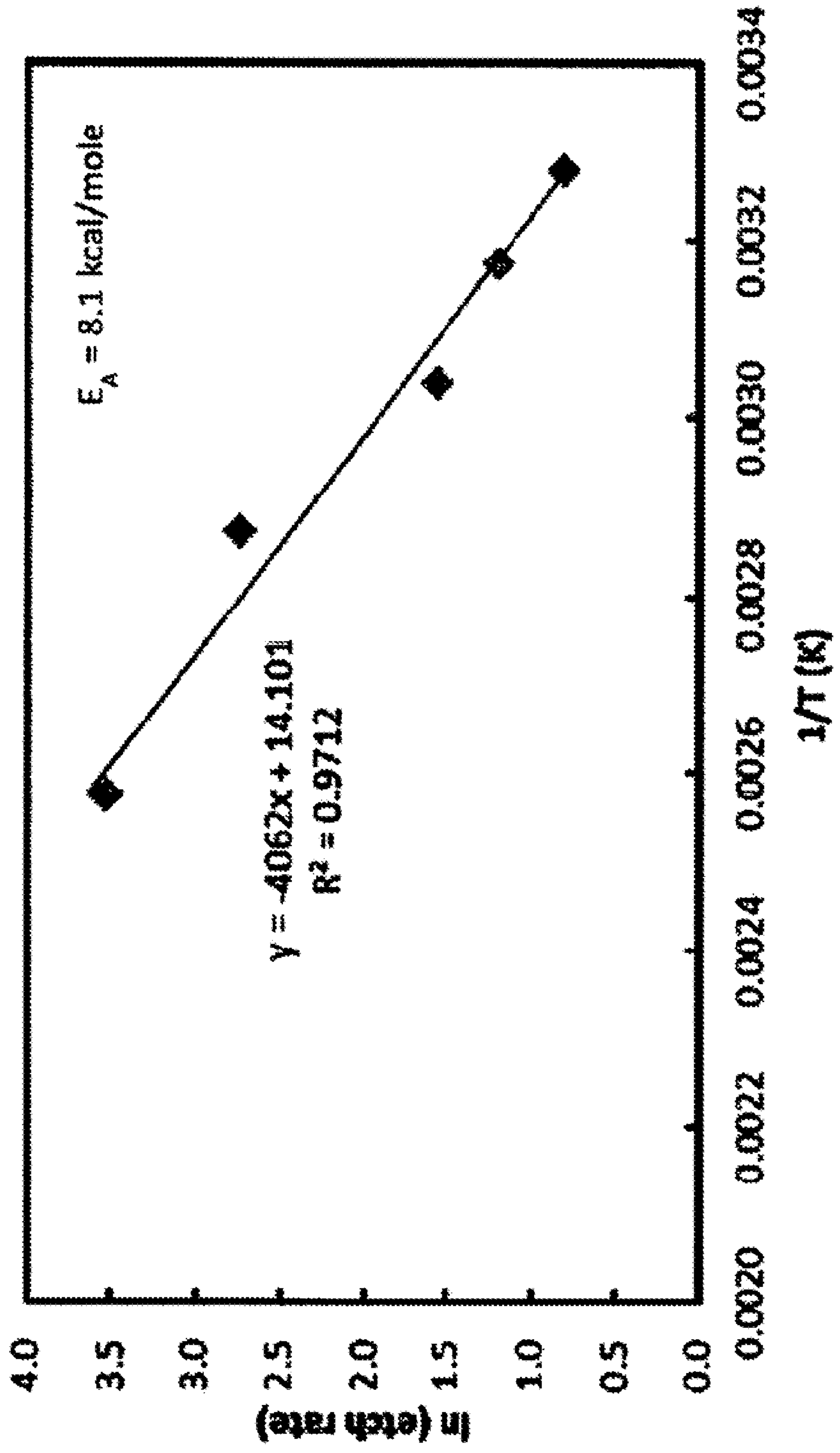
FIG. 10. Dependence of the natural log of the copper oxide etch rate on inverse temperature (K)

FIG. 10 shows a plot of the natural log of the etch rate versus the reciprocal of the absolute temperature in Kelvin. Using the relationship shown in the figure, the heating device can control the temperature of the substrate to increase the rate of etching. For a 300 mm long copper lead frame at 30° C. (303 K), the time needed to reduce a 50 nm oxide layer back to bare metal is 150 seconds at the scan speed of 2 mm/s. Heating the lead frame to 115° C. (388 K) decreases the time required to 8 seconds (equivalent to a scan speed of 38 mm/s).

Copper oxide etching is a reversible reaction. Heating the copper sample increases the etch rate by the atmospheric pressure argon and hydrogen plasma. However, if the process takes place in open air, then re-oxidation can occur on the hot copper surface. To prevent re-oxidation, the embodied invention can be performed in an inert gas environment, such as in argon or in nitrogen. One example is to insert the copper substrate, such as a lead frame strip, inside an enclosure, and purge the enclosure with hot argon or nitrogen gas while the substate is being scanned with the argon and hydrogen plasma. After etching away the copper oxide, the substate can be quickly cooled in flowing argon or nitrogen gas to ambient temperature. Once at ambient temperature, the copper oxidation rate is negligible, and the sample can be removed from the enclosure and transferred to the next processing step. Analysis of copper lead frame strips after removal from the purged environment did not show any evidence of re-oxidation over 8 hours storage at ambient conditions.

In the Description of Related Art, it was pointed out that copper oxide layers on copper lead frame strips are the source of delamination of the epoxy mold covering the die and wire bonds (refer to L. C. Yung, et al., IEEE Proceedings of the International Conference on Software Engineering, 2010, Kuala Lumpur, Malaysia, p. 654; and C. T. Chong, et al., IEEE Proceedings of the 45th Electronic Components and Technology Conference, Las Vegas, NV, USA, p. 463). Removal of the copper oxide with the argon and hydrogen plasma should eliminate this problem. Experiments were conducted on populated copper lead frame strips with dimensions of 70 mm×250 mm. The strips had been subjected to oxidation during previous processing steps in the semiconductor packaging operation. The lead frame strips were scanned at ambient temperature and pressure using a 4-inch (100 mm) wide linear plasma head fed with argon and hydrogen. The distance from the plasma source exit to the strip was about 1 mm. The 100 mm wide beam extend across the entire width of the 70 mm wide lead frame. The head was scanned down the length of the 250 mm long strip at scan speeds of 5, 10 and 20 mm/s. This yielded process times of 50, 25 and 12.5 seconds, respectively. The plasma was operated at 400 W of RF power, a gas feed rate of 30.3 liters per minute (LPM), and with a mixture of 0.46% hydrogen in argon.

After plasma treatment, the lead frame strips were placed in the mold machine, and the mold injected over all the die packages on the strips and cured. The packages were then examined for delamination at the die pad-mold interface. No delamination was observed at any of the die pads. Next, the strips were allowed to sit at 30° C. and a relative humidity of 60% for 168 hours before testing for delamination (MSL 3 test). Again, no delamination was observed on any of the packages. If the lead frame strips were not treated with the plasma, or were treated with an argon and oxygen plasma instead, delamination at the die pad-mold interface was observed.

In another embodiment of the invention, the copper lead frame strips and dies were cleaned with the argon and hydrogen plasma before wire bonding. The removal of the copper oxide from all the bond pads allowed copper wires to be bonded to the die and lead frame pads with strong adhesion. Such a process has many advantages in semiconductor packaging, because it simplifies the materials and processes needed to obtain reliable packages.

Example 4

Apparatus and Method of Depositing a Thin Film

Another embodiment of the invention is a method of depositing thin films with the argon plasma at atmospheric pressure and low temperature, wherein there is essentially no deposition of particles on the substrate. The embodiment has been reduced to practice by depositing glass-like films on silicon wafers. Here, a volatile chemical precursor is fed downstream at a second gas inlet located just after the exit of the plasma source. The volatile chemical precursor then combines with the reactive species in the afterglow of the plasma. The reactive species attack the chemical precursors, causing them to decompose and deposit a thin film on a substrate placed less than 1.0 centimeter downstream.

Figure 11:
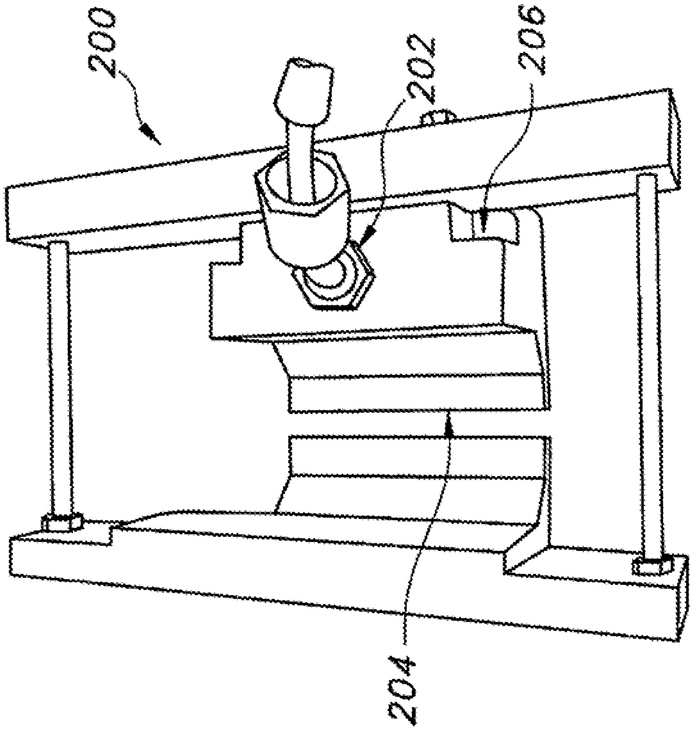
FIG. 11 shows a schematic of the attachment to the self-contained plasma housing for depositing coatings onto a substrate using the invention.

In FIG. 11, a schematic is presented of a Teflon attachment to the atmospheric pressure plasma source (refer to FIG. 3B). This apparatus is another embodiment of the invention. It is mounted directly onto the plasma source housing, and provides a means of uniformly distributing the volatile chemical precursors into the reactive gas beam exiting from the linear argon plasma source. Volatile chemical precursors are fed into the attachment 200 at a top port 202, and out through a slit 204 in the side near the base of the Teflon piece 206. After exiting the attachment, the precursor chemicals efficiently mix with the reactive species in the afterglow. These species attack the chemical precursor, causing it to decompose and deposit a thin film onto a substrate located a short distance downstream.

The organosilane precursor chemical used in this example is tetramethyl-cyclotetrasiloxane (TMCTS) which is delivered just below the plasma source fed with argon and oxygen. The plasma was operating at 120 W RF power using 18 LPM argon and 0.2 LPM oxygen and the plasma deposition system was scanned over the surface at 25 mm/s. Tetramethyl-cyclotetrasiloxane was dispersed into the carrier gas and introduced to the apparatus through the attachment system located 1.0 mm away from the gas exit from the plasma housing. The precursor chemical was delivered to the attachment by flowing helium through a bubbler filled with the liquid precursor. The flow rate through the bubbler was set at 0.4 LPM and an additional dilution of 3.0 LPM of helium was added to this gas stream before entering the deposition attachment. Silicon wafers, 6 inches in diameter, were placed on a holder 7 mm downstream of the attachment. The pitch of the robotic painting program as it scanned the wafer was fixed at 1 mm. The total dwell time of the atmospheric plasma housing and attachment over the silicon wafers was varied by altering the number of deposition cycles.

Differences in coating thickness are apparent by observing the color of the thin glass film. Before deposition, the silicon wafer has a uniform silver color. After deposition, one observes a bright blue coating generated by the deposited glass film. A color variation due to a thickness variation is observed at the edges of the film. However, over 90% of the film area, no significant variation in color is seen. This indicated a high degree of uniformity is achieved with the embodiment of the invention depicted in FIG. 11. Further details for operating a suitable plasma delivery device for implementing an embodiment of the invention can be found in U.S. Pat. Nos. 9,406,485 and 10,032,609, which are both incorporated by reference herein.

Example 5

Apparatus and Method of Cleaning and Activating a Metal Substrate

Another embodiment of the invention is an apparatus and method of cleaning and activating metal substrates with the low-temperature, atmospheric pressure, argon plasma apparatus, without the addition of substantial amounts of particles onto the metal substrates. One application of this embodiment is to improve the adhesion of coatings and glues to metal surfaces. Copper surface activation was accomplished using the atmospheric pressure, argon and oxygen plasma. The plasma scan speed over the substrate was varied from 5 to 100 millimeters per second, and the water contact angle of the copper was measured after each scan. A 43% reduction in water contact angle was observed at a speed of 50 mm/s. The water contact angle was reduced from 91° to 26° when the plasma scan speed was 5 mm/s. A low water contact angle is indicative of a hydrophilic surface. Such a surface should make strong bonds to coatings and glues.

The atmospheric pressure argon plasma removes organic contaminants from metal surfaces, and thereby increases the metal surface energy so that it will strongly bond to other materials. A copper lead frame was exposed to an argon plasma that was additionally fed with oxygen, nitrogen or hydrogen. After plasma treatment, the surface free energy (SFE), along with the polar and dispersive components of the SFE, was measured with a Krüss Mobile Surface Analyst. Exposure to the argon and oxygen plasma increased the polar component of the surface energy from <3 mN/m to 21 mN/m. Substantial increases in the polar component of the SFE was observed with the argon and nitrogen plasma and the argon and hydrogen plasma, although to a lesser extent than achieved with the argon and oxygen plasma. A large increase in the polar component of the surface energy is a good indication that the copper is activated for bonding to other materials. Further details for operating a suitable plasma delivery device for implementing an embodiment of the invention can be found in U.S. Pat. Nos. 9,406,485 and 10,032,609, and U.S. patent application Ser. No. 16/042,905, which are incorporated by reference herein.

Apparatus and methods are disclosed for generating an argon plasma for processing electronic materials that does not result in the contamination of the substrate with significant numbers of particles. A plasma apparatus with auto-tuning and temperature control methods has been developed which produces stable argon plasmas that may be used to process materials at atmospheric pressure and low temperature. The device contains a means for controlling the temperature of a flowing gas and a means for partially ionizing said flowing gas such that uniform and stable plasmas are generated without adding particles into the gas stream. Embodiments of the invention include processes that employ the argon plasma apparatus to treat materials at low temperature and high throughput without contaminating the substrate with particles, and at a cost which has been previously unavailable. One method uses the argon plasma device to remove organic materials. The methods further cover the robotic application of the low-temperature, atmospheric pressure plasma to a substrate all of which is contained in a particle-free enclosure. Another embodiment of the invention uses the argon plasma with hydrogen gas feed to remove metal oxide films from metals. In yet another embodiment, the argon plasma is combined with a means of introducing chemical precursors to the system thereby causing the plasma-enhanced chemical vapor deposition of a thin film onto a substrate without the additional co-deposition of particles. A further embodiment of the invention can use the plasma to clean and activate a metal substrate.

What is claimed is:

1. A method of producing an ionized gas plasma comprising:

flowing a gas flow through an inlet into a housing, the gas flow comprising argon and one or more molecular gases;

flowing the gas flow within the housing through a flow path for directing the gas flow;

a powered electrode disposed within the housing having a powered electrode surface exposed to the gas flow in the flow path;

disposing a grounded electrode adjacent to the powered electrode such that a grounded electrode surface is spaced to 3 mm or less from the powered electrode surface and the gas flow is directed therebetween in the flow path;

delivering radio frequency power with a power supply coupled to the powered electrode and the grounded electrode to cause the gas to become weakly ionized at a forward power between 100 and 550 W per 100 mm length of the electrodes, and to produce reactive neutral species in the gas flow in the flow path;

flowing the gas flow comprising the reactive neutral species from an outlet of the housing for argon plasma; and disposing a material substrate beneath the outlet of the housing to receive the reactive neutral species in the gas flow, thereby treating said material substrate with minimal particles deposited.

2. The method of claim 1, wherein the molecular gases are selected from a molecular gas group consisting of oxygen, nitrogen and hydrogen.

3. The method of claim 1, wherein a distance between the outlet of the housing and the material substrate is maintained to be less than 10 mm.

4. The method of claim 1, wherein the outlet is scanned over the material substrate at a speed between 1 and 300 mm/s.

5. The method of claim 1, wherein the reactive neutral species from the ionized gas plasma are used for cleaning organic contamination from the material substrate, removing oxide layers from metal structures on the material substrate, activating the material substrate surface for adhesion, etching a thin film off of the material substrate, or depositing a thin film onto the material substrate, all with minimal particles deposited.

6. The method of claim 1, wherein the housing is disposed within an enclosure at atmospheric pressure.

7. The method of claim 6, wherein the enclosure has laminar gas flow that is introduced through a high-efficiency particle filter to exclude excess particles.

8. The method of claim 1, wherein the gas flow from the outlet of the housing for the argon plasma is between 25 and 300° C.

9. The method of claim 1, wherein the power supply operates at a radio frequency of 13.56 or 27.12 MHz and includes a tuning network that impedance matches the radio frequency power supply to the argon plasma to minimize reflected power.

10. The method of claim 1, wherein the one or more molecular gases are added to the argon gas flow at a concentration between 0.1 to 2.0 volume %, and a fraction of the one or more molecular gases dissociates into atoms within the argon plasma, and then flows out of the outlet, wherein the atoms are selected from an atom group comprising O, H, N, F, C and S atoms.

* * * * *